US008610986B2

(12) United States Patent
Jain et al.

(10) Patent No.: US 8,610,986 B2
(45) Date of Patent: Dec. 17, 2013

(54) MIRROR ARRAYS FOR MASKLESS PHOTOLITHOGRAPHY AND IMAGE DISPLAY

(75) Inventors: Kanti Jain, Urbana, IL (US); Junghun Chae, Champaign, IL (US); Kevin Lin, Urbana, IL (US); Hyunjong Jin, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 285 days.

(21) Appl. No.: 12/419,210

(22) Filed: Apr. 6, 2009

(65) Prior Publication Data

US 2010/0255426 A1  Oct. 7, 2010

(51) Int. Cl.
*G02B 26/08* (2006.01)
*G02B 26/10* (2006.01)
*G02B 26/12* (2006.01)

(52) U.S. Cl.
USPC ........................................ 359/224.1; 359/904

(58) Field of Classification Search
USPC .......... 359/198.1–199.4, 200.6–200.8, 202.1, 359/221.2, 223.1–225.1, 226.2, 290–295, 359/584, 838, 846, 871, 872, 586, 588, 589, 359/354–359, 726–732; 250/204, 559.06, 250/559.29, 230, 234; 347/225–260; 353/39, 98–99; 385/15–18, 22; 398/12, 398/19, 45; 378/34–35; 101/450.1–473; 430/302–305
See application file for complete search history.

(56) References Cited

U.S. PATENT DOCUMENTS

| | | |
|---|---|---|
| 2,002,376 A | 5/1935 | Mannheimer |
| 3,694,080 A | 9/1972 | Malsky |
| 3,819,265 A | 6/1974 | Feldman et al. |
| 3,924,937 A | 12/1975 | Munroe et al. |
| 3,937,579 A | 2/1976 | Schmidt |
| 4,015,897 A | 4/1977 | Konoma et al. |
| 4,068,947 A | 1/1978 | Buckley et al. |
| 4,073,572 A | 2/1978 | Avicola |
| 4,171,870 A | 10/1979 | Bruning et al. |
| 4,190,352 A | 2/1980 | Bruning |

(Continued)

FOREIGN PATENT DOCUMENTS

| | | |
|---|---|---|
| JP | 6-310399 | 11/1994 |
| JP | 9-129546 | 5/1997 |

OTHER PUBLICATIONS

Pedrotti, F.L. and Pedrotti, L.S., Introduction to Optics, 2nd Ed. (1993), p. 402-404.*

(Continued)

*Primary Examiner* — Stephone B. Allen
*Assistant Examiner* — Kimberly N Kakalec
(74) *Attorney, Agent, or Firm* — Lathrop & Gage LLP

(57) ABSTRACT

Micromirrors and micromirror arrays described herein are useful, for example in maskless photolithography systems and methods and projection display devices and methods. According to one aspect, the micromirrors comprise a polymer structural layer and a reflective dielectric multilayer for selective reflection and/or redirection of incoming electromagnetic radiation. According to another aspect, incorporation of a reflective dielectric multilayer allows for use of polymer structural materials in micromirrors and prevents damage to such polymer materials due to excessive heating from absorption of electromagnetic radiation, as the reflective dielectric multilayers are highly reflective and minimize heating of the micromirror components. According to yet a further aspect, top down fabrication methods are described herein for making a micromirror comprising a polymer structural layer and a reflective dielectric multilayer.

28 Claims, 23 Drawing Sheets

(56) References Cited

U.S. PATENT DOCUMENTS

| | | |
|---|---|---|
| 4,283,116 A | 8/1981 | Weis |
| 4,302,079 A | 11/1981 | White |
| 4,332,473 A | 6/1982 | Ono |
| 4,362,384 A | 12/1982 | Engelbrecht et al. |
| 4,383,255 A | 5/1983 | Grandjean et al. |
| 4,537,478 A | 8/1985 | Richter |
| 4,564,836 A | 1/1986 | Vuilleumier et al. |
| 4,592,628 A | 6/1986 | Altman et al. |
| 4,631,416 A | 12/1986 | Trutna, Jr. |
| 4,653,860 A | 3/1987 | Hendrix |
| 4,657,350 A | 4/1987 | Mori |
| 4,662,746 A | 5/1987 | Hornbeck |
| 4,676,702 A | 6/1987 | Gerber |
| 4,701,608 A | 10/1987 | Morita et al. |
| 4,708,466 A | 11/1987 | Isohata et al. |
| 4,721,980 A | 1/1988 | Yazaki |
| 4,744,615 A | 5/1988 | Fan et al. |
| 4,748,477 A | 5/1988 | Isohata et al. |
| 4,749,867 A | 6/1988 | Matsushita et al. |
| 4,758,091 A | 7/1988 | Bodine |
| 4,775,877 A | 10/1988 | Kosugi et al. |
| 4,778,233 A | 10/1988 | Christenson et al. |
| 4,823,354 A | 4/1989 | Znotins et al. |
| 4,825,086 A | 4/1989 | Mueller |
| 4,838,693 A | 6/1989 | Uchida et al. |
| 4,879,605 A | 11/1989 | Warkentin et al. |
| 4,891,663 A | 1/1990 | Hirose |
| 4,901,109 A | 2/1990 | Mitome et al. |
| 4,924,257 A | 5/1990 | Jain |
| 4,962,318 A | 10/1990 | Nishi |
| 4,975,733 A | 12/1990 | Kumagaya et al. |
| 4,991,962 A | 2/1991 | Jain |
| 5,105,369 A | 4/1992 | Nelsen |
| 5,142,132 A | 8/1992 | MacDonald et al. |
| 5,150,152 A | 9/1992 | Isohata et al. |
| 5,166,830 A | 11/1992 | Ishibai et al. |
| 5,168,306 A | 12/1992 | Morimoto et al. |
| 5,178,974 A | 1/1993 | Hawryluk et al. |
| 5,194,893 A | 3/1993 | Nishi |
| 5,198,857 A | 3/1993 | Goto |
| 5,200,861 A | 4/1993 | Moskovich et al. |
| 5,216,537 A | 6/1993 | Hornbeck |
| 5,227,838 A | 7/1993 | Nakanishi et al. |
| 5,227,839 A | 7/1993 | Allen |
| 5,258,808 A | 11/1993 | Watanuki |
| 5,272,502 A | 12/1993 | Saiki |
| 5,285,236 A | 2/1994 | Jain |
| 5,291,240 A | 3/1994 | Jain |
| 5,311,360 A | 5/1994 | Bloom et al. |
| 5,328,073 A | 7/1994 | Blanding et al. |
| 5,396,891 A | 3/1995 | Vogt et al. |
| 5,430,816 A | 7/1995 | Furuya et al. |
| 5,448,395 A | 9/1995 | Lopez et al. |
| 5,452,024 A | 9/1995 | Sampsell |
| 5,473,408 A | 12/1995 | Hoffman et al. |
| 5,473,410 A | 12/1995 | Nishi |
| 5,477,304 A | 12/1995 | Nishi |
| 5,517,000 A | 5/1996 | Nishiwaki et al. |
| 5,523,193 A | 6/1996 | Nelson |
| 5,535,047 A * | 7/1996 | Hornbeck ..................... 359/295 |
| 5,563,095 A | 10/1996 | Frey |
| 5,563,684 A | 10/1996 | Stagaman |
| 5,583,688 A | 12/1996 | Hornbeck |
| 5,601,733 A | 2/1997 | Partlo |
| 5,624,437 A | 4/1997 | Freeman et al. |
| 5,625,436 A | 4/1997 | Yanagihara et al. |
| 5,631,782 A | 5/1997 | Smith et al. |
| 5,652,645 A | 7/1997 | Jain |
| 5,691,541 A | 11/1997 | Ceglio et al. |
| 5,710,619 A | 1/1998 | Jain et al. |
| 5,719,695 A | 2/1998 | Heimbuch |
| 5,721,606 A | 2/1998 | Jain |
| 5,757,552 A | 5/1998 | Murayama et al. |
| 5,760,880 A | 6/1998 | Fan et al. |
| 5,793,473 A | 8/1998 | Koyama et al. |
| 5,835,256 A | 11/1998 | Huibers |
| 5,835,647 A | 11/1998 | Fischer et al. |
| 5,870,176 A | 2/1999 | Sweatt et al. |
| 5,897,986 A | 4/1999 | Dunn et al. |
| 5,905,007 A | 5/1999 | Ho et al. |
| 5,917,594 A | 6/1999 | Norton |
| 5,923,403 A | 7/1999 | Jain |
| 5,999,306 A | 12/1999 | Atobe et al. |
| 6,018,383 A | 1/2000 | Dunn et al. |
| 6,037,564 A | 3/2000 | Tatah |
| 6,046,840 A | 4/2000 | Huibers |
| 6,071,616 A | 6/2000 | Sulzbach et al. |
| 6,111,900 A | 8/2000 | Suzudo |
| 6,238,852 B1 | 5/2001 | Klosner |
| 6,247,037 B1 | 6/2001 | O'Callaghan |
| 6,282,010 B1 | 8/2001 | Sulzbach et al. |
| 6,304,316 B1 | 10/2001 | Jain et al. |
| 6,312,134 B1 | 11/2001 | Jain et al. |
| 6,317,947 B1 | 11/2001 | Ruschmann |
| 6,366,308 B1 | 4/2002 | Hawryluk et al. |
| 6,416,908 B1 | 7/2002 | Klosner et al. |
| 6,445,442 B2 | 9/2002 | Von Bunau et al. |
| 6,473,237 B2 | 10/2002 | Mei |
| 6,504,644 B1 | 1/2003 | Sandstrom |
| 6,515,257 B1 | 2/2003 | Jain et al. |
| 6,529,262 B1 | 3/2003 | Mei et al. |
| 6,544,698 B1 | 4/2003 | Fires |
| 6,577,380 B1 | 6/2003 | Sposili et al. |
| 6,601,960 B2 * | 8/2003 | Richard ..................... 359/883 |
| 6,707,534 B2 | 3/2004 | Bjorklund et al. |
| 6,717,650 B2 | 4/2004 | Jain |
| 6,774,983 B2 | 8/2004 | Kuchibhotla |
| 6,798,561 B2 | 9/2004 | Huibers |
| 6,859,311 B2 | 2/2005 | Williams et al. |
| 6,862,127 B1 | 3/2005 | Ishii |
| 6,870,554 B2 | 3/2005 | Jain |
| 6,903,860 B2 | 6/2005 | Ishii |
| 6,953,268 B2 | 10/2005 | Kimura et al. |
| 6,976,778 B2 | 12/2005 | Kamijima |
| 7,016,128 B2 | 3/2006 | Westra et al. |
| 7,068,415 B2 | 6/2006 | Mushika |
| 7,092,138 B2 | 8/2006 | Wang et al. |
| 7,106,415 B2 | 9/2006 | Kuchibhotla et al. |
| 7,158,305 B2 | 1/2007 | Raghunandan et al. |
| 7,164,465 B2 | 1/2007 | Klosner et al. |
| 7,170,669 B1 | 1/2007 | Jain et al. |
| 7,173,751 B2 | 2/2007 | Yun |
| 7,209,276 B2 | 4/2007 | Hong et al. |
| 7,261,430 B1 | 8/2007 | DeNatale et al. |
| 7,295,363 B2 | 11/2007 | Patel et al. |
| 7,420,730 B2 | 9/2008 | Jain et al. |
| 7,426,067 B1 | 9/2008 | Bright et al. |
| 7,468,238 B2 | 12/2008 | Fries |
| 7,477,440 B1 | 1/2009 | Huang |
| 2002/0029975 A1 | 3/2002 | Westra et al. |
| 2002/0056900 A1 | 5/2002 | Liu et al. |
| 2002/0102102 A1 | 8/2002 | Watanabe et al. |
| 2002/0109903 A1 | 8/2002 | Kaeriyama |
| 2002/0171816 A1 | 11/2002 | Markle |
| 2003/0007226 A1 | 1/2003 | Buzzetta |
| 2004/0008406 A1 | 1/2004 | Blitstein |
| 2004/0047057 A1 * | 3/2004 | Pouteau et al. ............... 359/883 |
| 2005/0041277 A1 | 2/2005 | Huibers |
| 2005/0146768 A1 * | 7/2005 | Wang et al. .................... 359/245 |
| 2005/0243300 A1 * | 11/2005 | Pate et al. ....................... 355/99 |
| 2006/0050356 A1 | 3/2006 | Varaprasad et al. |
| 2006/0109576 A1 | 5/2006 | Baba-Ali |
| 2006/0209386 A1 | 9/2006 | Sudak et al. |
| 2006/0245036 A1 | 11/2006 | Neidrich |
| 2007/0166863 A1 | 7/2007 | Kim |
| 2007/0195439 A1 * | 8/2007 | DeNatale et al. ............. 359/871 |
| 2007/0236770 A1 * | 10/2007 | Doherty et al. ............... 359/238 |
| 2008/0074728 A1 * | 3/2008 | Ogikubo et al. .............. 359/292 |
| 2008/0099804 A1 | 5/2008 | Venezia et al. |
| 2008/0225370 A1 * | 9/2008 | Mansell ..................... 359/224 |

(56) References Cited

U.S. PATENT DOCUMENTS

2008/0239442 A1* 10/2008 Gim et al. .................... 359/223
2009/0002805 A1 1/2009 Yang et al.

OTHER PUBLICATIONS

Yi-Chung Tung and Katsuo Kurabayashi, A Metal-Coated Polymer Micromirror for Strain-Driven High-Speed Multiaxis Optical Scanning, IEEE Photonics Technology Letters, vol. 17, No. 6, pp. 1193-1195, Jun. 2005.*
Thilo Sandner, Jan Uwe Schmidt, Harald Schenk, Hubert Lakner, Minghong Yang, Alexandre Gatto, Norbert Kaiser, Stefan Braun, THomas Foltyn, Andreas Leson, Highly Reflective Optical Coatings for High Power Applications of Micro Scanning Mirrors in the UV-VIS-NIR Spectral Region, Proc. of SPIE 6114, pp. 61140H-1-61140H-15, 2006.*
Douglass, M. (2003) "DMD Reliability: A MEMS Success Study," *Proc SPIE* 4980.
Friese et al. (2003) "Polymer-Based Membrane Mirrors for Micro-Optical Sensors," *Proc. IEEE Sens* 1:667-672.
Hogan, H. (2005) "Maskless Photolithography May Offer Cost Advantage," http://www.photonics.com/Content/ReadArticle.aspx?ArticleID=23699.
Li et al. (2004) "Mirror Coating and Packaging for a Horizontal MEMS Optical Switch Array," *Electronic Components and Technology Conference* pp. 1400-1405.
Schenk et al. (Oct./Dec. 2005) "Micro-Opto-Electro-Mechanical Systems Technology and its Impact on Photonic Applications," *J. Microlith. Microfab. Microsyst.* 4(4):041501.
Tripp et al. (2005) "Multilayer Coating Method for X-Ray Reflectivity Enhancement of Polysilicon Micro-Mirrors at 1.54 Å Wavelength," *Proc. SPIE* 5720:241-251.

* cited by examiner

MIRROR ARRAYS FOR MASKLESS PHOTOLITHOGRAPHY AND IMAGE DISPLAY

CROSS REFERENCE TO RELATED APPLICATION

Not Applicable.

BACKGROUND OF THE INVENTION

This invention is in the field of digital micromirror devices. This invention relates generally to micromirror devices employing polymeric structural layers and high reflectivity dielectric multilayers and methods for making and using micromirror devices.

In the fabrication of electrical, opto-electronic, micro system and display products, microelectronic fabrication methods such as deposition, photolithography and etching processes are used to make millions of microstructures or micro devices on a substrate. The substrate for micro fabrication can be silicon wafers, compound semiconductor wafers, glass, polymers, printed circuit boards (PCB), multi chip modules, etc. The size of the substrate ranges from a few square inches in integrated circuits up to a few square meters in displays. On these substrates, microstructures and devices such as transistors, capacitors, resistors, interconnects or any kind of electronic components are fabricated by microelectronic fabrication methods. Pattern sizes that can be fabricated range from submicron features up to a few microns, depending on their purpose.

In the fabrication of microstructures for applications mentioned above, patterning technologies and etching methods are required to make active or passive functional devices. Photolithography technology is commonly used to make patterned materials on a substrate. In photolithography methods, the material is coated or deposited with photoresist (PR) by various kinds of methods. Then, the PR is baked and stabilized for the next process. In the subsequent process, light is illuminated through a patterned mask and then the polymer bonds of the photosensitive chemical component of the PR in the illuminated area are, depending on the tone of the PR, dissociated or cross-linked due to illumination energy. Following this process, again depending on the tone of PR, the illuminated or non-illuminated PR is dissolved by developer and the underlying materials are opened. PR protects the material from being etched in the wet etch and dry etch processes. The materials exposed to the etch environment without a PR covering are etched by dry etching or wet chemical etching. For the last process step, the remaining PR on the material is removed by a PR stripper, resulting in patterned materials on the substrate.

For the lithography methods described above, three kinds of lithography methods are currently used: contact printing methods, projection imaging methods and focused beam laser direct writing methods. In contact printing methods, the mask containing the master pattern mechanically makes contact with the PR coated substrate and then is illuminated by a light source. The chemical property of PR changes due to illumination. There are, however, serious disadvantages which make contact printing methods difficult to use and discouraging industry adoption. Due to the mechanical contact between the mask and PR, the mask could be contaminated by PR where some polymer residue is transferred onto the mask. This defect on the mask can make undesired patterns on future substrates by blocking the illumination.

Projection imaging methods are commonly used for fabrication of integrated circuits (ICs), displays and other microelectronic products. A projection imaging system generally comprises three parts: a light source, which generates light with a desired wavelength, energy and uniformity; optical components which transmit the light from the source to a substrate; and a stage which holds the substrate and allows for high-precision movement for pattern alignment. Among these components, optical components generally comprise several lenses for uniformity and alignment to the substrate.

Two projection imaging method are generally used: scan type projection and stepping type projection. In scan type projection systems, the illumination is scanned on the entire substrate area by moving the optical parts or the substrate. An advantage of this method is large-size availability because this technique illuminates large area at one time. This method can be used for displays or large size IC fabrications which require a large-size substrate. However, a primary disadvantage of this method is the price of photolithography systems. For photolithography systems, if the sizes of the lenses in the optical parts become larger, the price of the system becomes much higher than those of other mechanical parts.

In stepping type projection methods, the whole substrate area is divided into several segments and is illuminated segment by segment in order. This method is useful when repetitive patterns are generated on a substrate. For special purpose such as large size display fabrication with an area of several square meters, both scanning and stepping methods are used. A primary disadvantage of the stepping method is its non-uniform illumination on a large size substrate. Due to the mechanical alignment issues in the stepping method, there can be regions where the illumination is duplicated or not illuminated as shown in FIG. 1. The substrate 101 is illuminated by three stepping shots 102, 103 and 104. If there is a misalignment in the second shot 103, the illumination energy can be doubled in the region 105 where the illumination is duplicated. However, between the second shot 103 and third shot 104, there will be a non-illuminated region 106, where the energy of illumination is zero. The patterns on the border area can also be over-developed or under-developed because there is difference of illumination energy. In the case of display fabrication such as TFT-LCD, the non uniform pattern in the substrate can make non-uniform images. This problem is referred to as the stitching problem, and there have been extensive efforts to reduce the problem.

The third patterning method is called the laser ablation method. A laser is illuminated through a patterned mask, and the selected area on the substrate is illuminated by the laser. Due to the high energy density of the laser source, the material on the substrate will undergo chemical reactions, physical reactions or other types of reactions. Essentially, the illuminated area is removed by the laser ablation and only the non-illuminated area will remain, and thus the patterning is accomplished by laser illumination. This method is very simple and economical because it does not need a PR coating system, a developing system, a bake system or a PR stripping system. Thus, the total fabrication time of the whole product also decreases due to the reduced number of fabrication steps, and the resulting reduction in fabrication cost. However, this method is not commonly used for the display industry because the materials that can be ablated by laser are limited. Among the materials that are used in TFT-LCD or PDP process is ITO (Indium Tin Oxide), a type of transparent conductor. This material can be ablated by excimer laser illumination. Also, some types of organic materials can be ablated by a laser.

For the fabrication of patterns on a substrate using methods involving illumination by radiation, a photomask is required for selective illumination on the substrate. FIG. 2 shows how a photomask is utilized in the photolithography process. In lithography equipment such as the stepper or scanner, illumination source 201 generates illumination radiation 202. Optics components 203 and 204 are required to make images on the substrate 205. In the middle of the illumination path, a photomask 206 is placed to differentiate areas on the substrate 205. The photomask consists of transparent and opaque areas, so that the illumination through the openings of the photomask 206 reaches the substrate 205 and other illumination is blocked by photomask 206. A photosensitive layer, usually photoresist, is coated on the substrate 205 and the illumination causes photochemical effects on the photoresist.

A photomask typically comprises a base material 301, a mask material 302 and an antireflective material 303, as shown in FIG. 3. For the base material 301, fused silica (quartz), calcium fluoride or glass is commonly used because such material has high transparency for the wavelength of the common illumination source. For the masking material 302, chrome is commonly used but other types of materials such as aluminum can also be used. The antireflective material 303 is used to avoid unwanted images generated by reflected light from substrate.

In an example photomask fabrication method, chrome 302, antireflective layer 303 and e-beam resist are coated on the quartz substrate 301 and patterned by e-beam lithography or other methods. The e-beam resist is removed after making the pattern on the photomask. The dimension, width and length, of chrome 302 and antireflective coating 303 needs to be very precise because the pattern on the photomask is exactly transferred to the substrate. Therefore, a very precise and expensive process is required for the fabrication of photomasks.

One of the most important concerns of photomask production is the price. Once a photomask is fabricated with a certain design, it is permanent and cannot be modified after its fabrication. There are several cost related problems in the industry due to the non-modifiable nature and the expensive cost of the photomask. First, multiple photomasks are typically required for device fabrication. Although the required number of photomasks varies different from device to device, it is common that more than 10 photomasks are required for fabrication of conventional CPU or RAM devices.

Second, in addition to the requirement of photomasks with varying patterns, additional photomasks are further required for mass production to accommodate for revisions and aging. In the production of electronic devices, there are often many revisions on the design of a device for better performance or cost efficiency, and new photomasks are typically purchased for each revision. Also, photomasks generally need replacement after some time period because they tend to degrade when used for a long time. When a photomask is used in mass production, defects caused by particles or scratches are generated on the photomask during usage and a replacement photomask is eventually needed.

Third, considering the use of photomasks in the display industry, the price problem of photomasks becomes more severe because the size of the photomask required is much larger than those used in IC fabrication. For example, the size of the photomask used in a $7^{th}$ generation TFT-LCD plant is 1220 mm×1400 mm (reference: Nikon FX-71S catalog). The cost of the photomask is not disclosed, but it is well known that the price increases exponentially as the size of photomask increases linearly. It is expected that tens of thousand of dollars are required for such a large size photomask. For these and other reasons, the use of photomasks has become a large burden to the device fabrication industry and flat panel display fabrication industry.

SUMMARY OF THE INVENTION

The maskless lithography technology described herein uses micromirror arrays for the selective illumination of a substrate resulting in pattern fabrication on a substrate without using a photomask.

In one aspect, provided herein is micromirror. A micromirror of this aspect comprises a polymeric mirror base having an exposed surface area, a reflective dielectric multilayer disposed over the polymeric mirror base, and a device layer positioned below the polymeric mirror base for adjusting a position of the micromirror. In embodiments, micromirrors have widths and/or lengths selected over the range of 5 to 100 µm. In a specific embodiment, the exposed surface area of a micromirror is greater than or equal to 25 $\mu m^2$, for example selected over the range of 25 $\mu m^2$ to 0.1 $mm^2$ or selected over the range of 25 $\mu m^2$ to 1 $mm^2$.

In some embodiments, the reflective dielectric multilayer of a micromirror covers 50% to 100% of the exposed surface area of the polymeric base. Preferably, for some embodiments, the reflective dielectric multilayer covers 70% to 100% of the exposed surface area, for example 80% to 100% of the exposed surface area, 90% to 100% of the exposed surface area or 100% of the exposed surface area.

Useful dielectric layers of a reflective dielectric multilayer include, but are not limited to dielectric oxides, nitrides, fluorides, and sulfides. For example, useful dielectrics include silicon dioxide, titanium dioxide, hafnium oxide, silicon nitride, magnesium fluoride, and zinc sulfide. In specific embodiments, the reflective dielectric multilayer comprises 10 or more dielectric layers, for example 10 to 1000 dielectric layers. In a specific embodiment, adjacent dielectric layers of a reflective dielectric multilayer have different refractive indices, for example dielectric layers alternating between higher and lower refractive index dielectric layers. In specific embodiments, the refractive indices of the higher refractive index dielectric layers are selected over the range of 1.2 to 2.9 and/or the refractive indices of the lower refractive index dielectric layers are selected over the range of 1.1 to 2.8. In embodiments, each dielectric layer of a reflective dielectric multilayer has a thickness selected over the range of 10 nm to 100 µm.

In a specific embodiment, a reflective dielectric multilayer does not include a metal layer. In some embodiments, a reflective dielectric multilayer is supported by a metal layer. For some embodiments, the metal layer receives 0% to 10% of the incident electromagnetic radiation; the reflective dielectric multilayer reflects 90% to 100% of the incident electromagnetic radiation. For some embodiments, the metal layer has a lower reflectivity than that of the reflective dielectric multilayer.

In certain embodiments, the reflective dielectric multilayer has a reflectivity selected over the range of 90% to 100% for at least a portion of electromagnetic radiation having wavelengths in the range of 150 to 1100 nm. Preferably, the reflective dielectric multilayer has a reflectivity selected over the range of 95% to 100% for at least a portion of electromagnetic radiation having wavelengths in the range of 150 to 1100 nm. Even more preferably, the reflective dielectric multilayer has a reflectivity selected over the range of 98% to 100% for at least a portion of electromagnetic radiation having wavelengths in the range of 150 to 1100 nm.

In embodiments, a reflective dielectric multilayer has a reflectivity tuned for specific regions of the electromagnetic spectrum. In example embodiments, a reflective dielectric multilayer has a reflectivity tuned for optimum reflection of red, blue or green electromagnetic radiation. In a specific embodiment, the reflective dielectric multilayer has a reflectivity selected over the range of 90% to 100%, 95% to 100% or 98% to 100% for at least a portion of electromagnetic radiation having wavelengths in the range of 600 to 750 nm, a reflectivity selected over the range of 90% to 100%, 95% to 100% or 98% to 100% for at least a portion of electromagnetic radiation having wavelengths in the range of 500 to 600 nm and/or a reflectivity selected over the range of 90% to 100%, 95% to 100% or 98% to 100% for at least a portion of electromagnetic radiation having wavelengths in the range of 400 to 500 nm.

In an embodiment, a micromirror further comprises a resistive heating element and/or a temperature sensor in thermal contact with a reflective dielectric multilayer. Optionally, a micromirror further comprises a thermally conductive and/or heat dispersing layer in thermal contact with the reflective dielectric multilayer and the resistive heating element and/or the temperature sensor. Resistive heating elements and/or temperature sensors are useful for controlling and/or monitoring the temperature of the micromirror. For some dielectric reflective multilayers, the reflectivity is temperature dependent. For example, as the temperature of some reflective dielectric multilayers increases, the reflectivity of the dielectric multilayer may increase or decrease. Similarly, as the temperature of some reflective dielectric multilayers decreases, the reflectivity of the dielectric multilayer may increase or decrease. By monitoring and/or controlling the temperature of the reflective dielectric multilayer, it is possible to ensure the maximum reflectivity of the reflective dielectric multilayer is being utilized. In specific embodiments, a resistive heating element and temperature sensor maintains a temperature of the reflective dielectric multilayer within a 1° C. window, a 5° C. window or a 10° C. window.

Polymers useful for the polymeric mirror base include, but are not limited to SU-8 (photoresist), polyimide, photoresists, polydimethylsiloxane (PDMS), polymethyl methacrylate (PMMA), polyparaxylene (parylene), polytetrafluoroethylene (Teflon), liquid crystal polymers and any combination of these. In embodiments, the polymeric mirror base provides a structural component to the micromirror. In some embodiments, use of a polymeric mirror base allows for production of a low cost micromirror, for example a mirror of lower cost than that produced using other materials. In a specific embodiment, the polymeric mirror base does not include a metallic sheath, for example utilized for providing structural rigidity.

In another aspect, provided herein are large area micromirror arrays. A large area micromirror array of this aspect comprises a plurality of micromirrors, wherein each micromirror element has an exposed surface area and comprises a polymeric base and a reflective dielectric multilayer disposed over the polymeric base. In specific embodiments, a micromirror array element comprises a micromirror as described above. In one embodiment, a large area micromirror array further comprises driving circuitry to control the position of each individual micromirror within the micromirror array.

In a specific embodiment, a large area micromirror array comprises 1 million or more micromirror elements. In an exemplary embodiment, a large area micromirror array comprises 10 million or more micromirror elements. For large micromirror array of some embodiments, a total exposed surface area of the plurality of micromirrors is 0.1 cm$^2$ or greater. In one embodiment, a total exposed surface area of the plurality of micromirrors is 0.5 cm$^2$ or greater, or 1 cm$^2$ or greater. In specific embodiments, a micromirror array comprises 2 to 10 million micromirror elements, 2 to 100 million micromirror elements or 2 to 1 billion micromirror elements, and/or has a total exposed surface area of the plurality of micromirrors of 0.1 cm$^2$ to 1 cm$^2$, 0.1 cm$^2$ to 10 cm$^2$ or 0.1 cm$^2$ to 100 cm$^2$.

In another aspect, provided herein are digital micromirror display devices. A digital micromirror display device of this aspect comprises a source of electromagnetic radiation; and a micromirror array comprising a plurality of micromirror elements, wherein each micromirror element has a surface area exposed to electromagnetic radiation from the source and comprises a polymeric base and a reflective dielectric multilayer disposed over the polymeric base. In specific embodiments, a micromirror array element comprises a micromirror as described above. A digital micromirror display device of one embodiment further comprises driving circuitry to control a position of each individual micromirror element.

Also provided herein are methods for making a micromirror. A method of this aspect comprises the steps of: providing a first substrate having a first surface; providing one or more metal electrodes on the first surface of the first substrate; providing a first polymer layer over one or more regions of the first surface of the first substrate; providing a second substrate; providing a sacrificial layer over the second substrate; providing a reflective dielectric multilayer on the sacrificial layer; providing a metal layer over the reflective dielectric multilayer; providing a second polymer layer over the metal layer; contacting the second polymer layer of the second substrate with the first polymer layer of the first substrate; and removing the sacrificial layer, thereby separating the second substrate from the reflective dielectric multilayer.

In a specific embodiment, the reflective dielectric multilayer comprises a plurality of dielectric layers selected from the group consisting of: oxides, nitrides, fluorides and sulfides. For example, useful dielectric layers include, but are not limited to dielectric layers comprising silicon oxide, silicon nitride, magnesium fluoride, tantalum oxide, zinc sulfide, titanium oxide. In a specific embodiment, the reflective dielectric multilayer comprises 2 or more, 5 or more, or 10 or more dielectric layers, for example 2 to 1000 dielectric layers.

In some embodiments, the first and/or second polymer layer comprises a polymer selected from the group consisting of: SU-8, polyimide, photoresists, polydimethylsiloxane (PDMS), polymethyl methacrylate (PMMA), polyparaxylene (parylene), polytetrafluoroethylene (Teflon), liquid crystal polymers and any combination of these. Useful sacrificial layer include, but are not limited to layers comprising dielectrics, photoresists, polymers, metals, metallic compounds and any combination of these. For example, a useful sacrificial layer comprises photoresist, polymer, metal oxide dielectric, PMMA, polyimide, silicon dioxide, silicon nitride, silicon, Al, Ti, Cr, Fe, Co, Ni, Cu, Zn, Mo, Ag, Pd, AlSi, AlCu and any combination of these. Useful sacrificial layers also include layers comprising a material which can be removed without damaging other structural or functional layers.

Also provided herein are maskless photolithography methods. A method of this aspect comprises the steps of: providing a substrate; providing a source of electromagnetic radiation; providing an array of micromirror elements, wherein each micromirror element has a surface area exposed to the electromagnetic radiation and comprises a polymeric base and a reflective dielectric multilayer disposed over the polymeric base; controlling a position of each micromirror element of the array such that electromagnetic radiation from the source is reflected from each micromirror element to a location either on or off of the substrate; and directing electromagnetic radiation from the source onto the micromirror array, thereby generating a reflected pattern of electromagnetic radiation on the substrate. In specific embodiments, a micromirror array element comprises a micromirror as described above.

In embodiments, the substrate comprises a layer of photoresist and/or the electromagnetic radiation has wavelengths selected over the range of 150 to 1100 nm. In a preferred embodiment, the reflective dielectric multilayer of at least one micromirror element has a reflectivity greater than 90% or 98% for at least a portion of electromagnetic radiation having a wavelength in the range of 150 to 1100 nm.

In another aspect, provided herein are methods of displaying an image and/or pattern. A method of this aspect comprises the steps of: providing a surface for displaying the image; providing a source of electromagnetic radiation; providing an array of micromirror elements; controlling a position of each micromirror element of the array such that electromagnetic radiation from the source is reflected from each micromirror element to a location either on or off of the surface; and directing electromagnetic radiation from the source onto the micromirror array, thereby displaying an image on the surface. In specific embodiments, a micromirror array element comprises a micromirror as described above. In an exemplary embodiment, the position of each micromirror of the array is controlled multiple times in sequence to display multiple images in sequence on the surface.

In a specific embodiment, the reflective dielectric multilayer of at least one micromirror element has a reflectivity greater than 90%, 95% or 98% for at least a portion of electromagnetic radiation having a wavelength in the range of 600 to 750 nm. In another specific embodiment, the reflective dielectric multilayer of at least one micromirror element has a reflectivity greater than 90%, 95% or 98% for at least a portion of electromagnetic radiation having a wavelength in the range of 500 to 600 nm. In another specific embodiment, the reflective dielectric multilayer of at least one micromirror element has a reflectivity greater than 90%, 95% or 98% for at least a portion of electromagnetic radiation having a wavelength in the range of 400 to 500 nm.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION OF THE INVENTION

Figure 1:
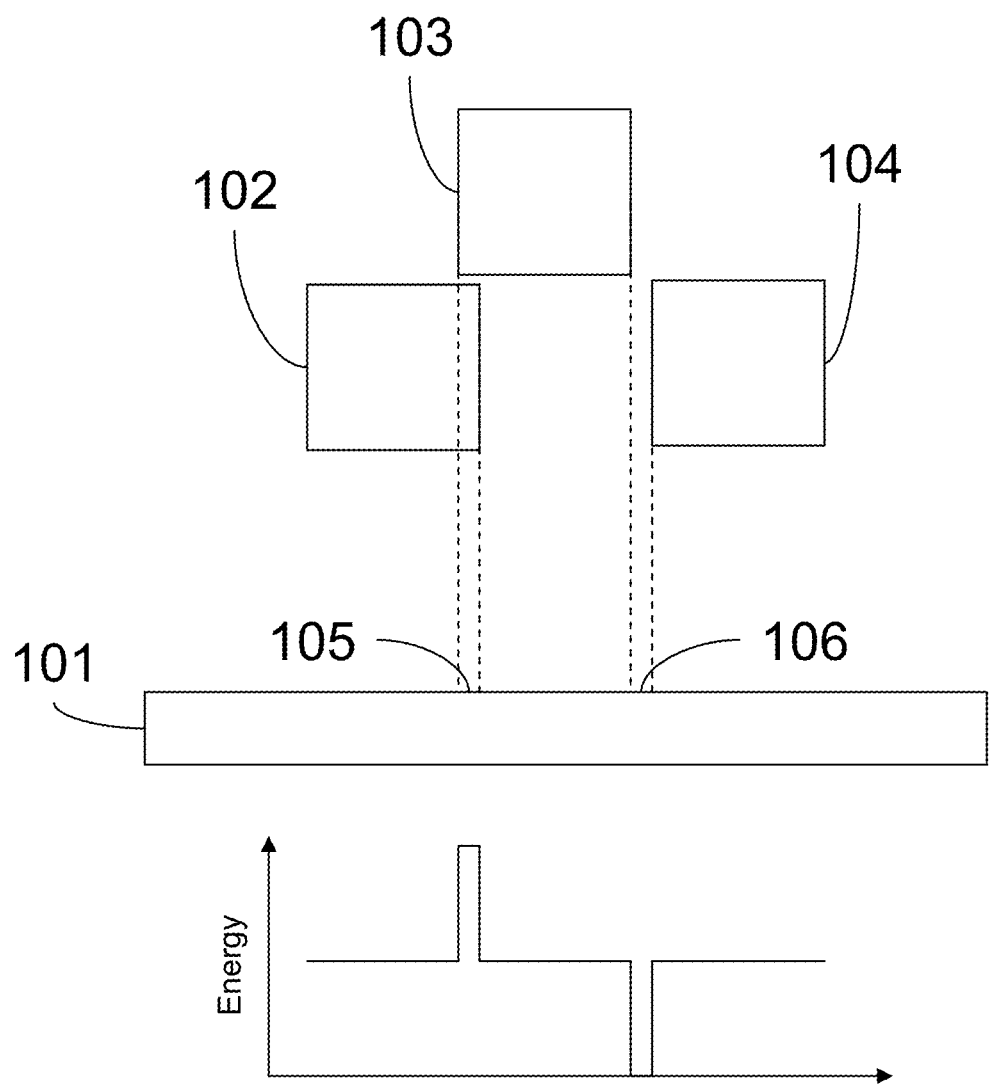
FIG. 1 illustrates a stepping type projection method.
Figure 2:
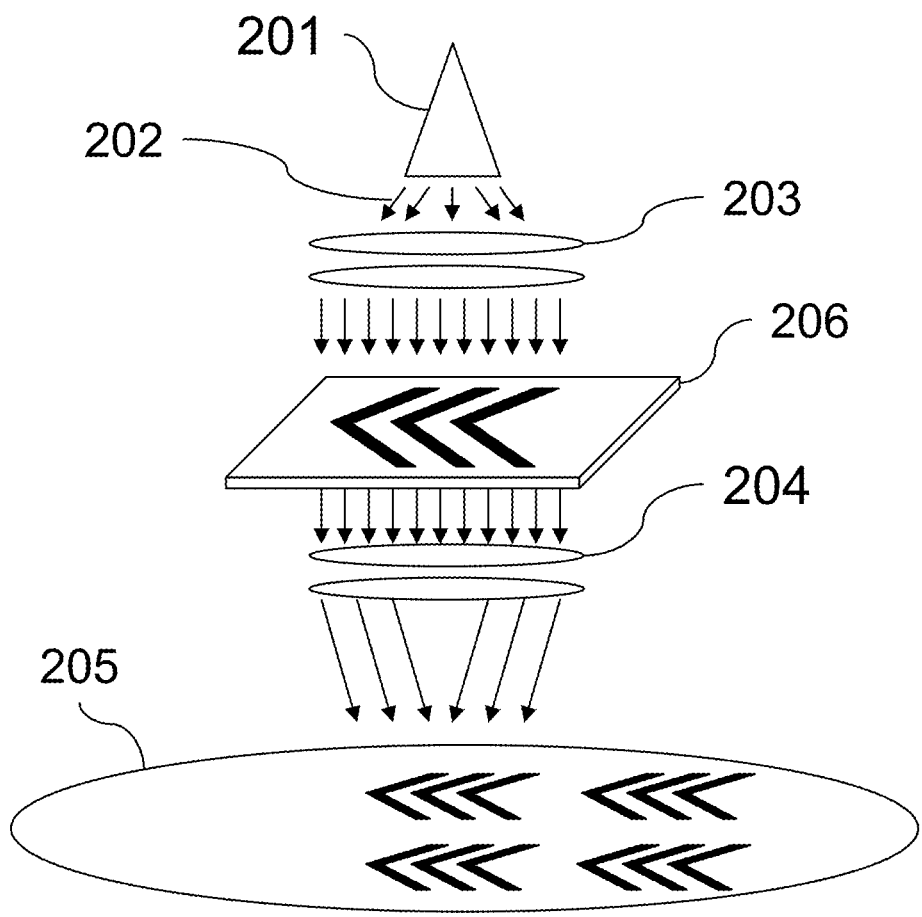
FIG. 2 illustrates a photomask used in a photolithography method.
Figure 3:
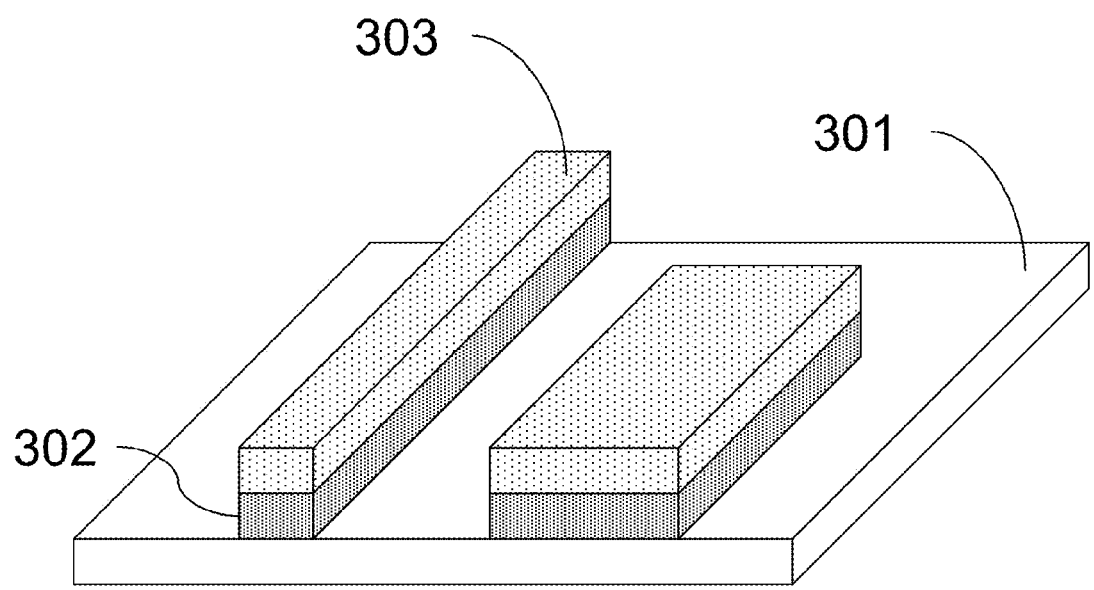
FIG. 3 illustrates components of a photomask.

In general the terms and phrases used herein have their art-recognized meaning, which can be found by reference to standard texts, journal references and contexts known to those skilled in the art. The following definitions are provided to clarify their specific use in the context of the invention.

"Micromirror" refers to a reflective element having dimensions selected between 1 µm and 1000 µm. In certain embodiments, a micromirror is a reflective microelectromechanical system (MEMS) device capable of selectively directing reflected electromagnetic radiation.

"Mirror base" refers to a structural component of a mirror and excludes a reflective layer providing the reflectivity of the mirror. In some embodiments, a mirror base comprises a polymer. In some embodiments, a mirror base has an exposed surface area for receiving electromagnetic radiation from a radiation source.

"Reflective dielectric multilayer" refers to a stack of dielectric layers of alternating and/or varying index of refraction which provide a high reflectivity for electromagnetic radiation, for example a reflectivity greater than 90%, greater than 95%, greater than 98%, or greater than 99%. In some embodiments a reflective dielectric multilayer has a reflectivity selected between 90 and 100%, between 95 and 100%, between 98 and 100% or between 99 and 100%. In certain embodiments, a reflective dielectric multilayer consists essentially of dielectric layers. In one embodiment, the reflectivity of a dielectric multilayer is provided exclusively by the dielectric layers and/or is independent from the reflectivity of an underlying metallic layer. In specific embodiments, a reflective dielectric multilayer comprises 2 or more, 5 or more, or 10 or more dielectric layers, for example 2 to 1000 dielectric layers.

"Device layer" refers to electronic, magnetic, electromagnetic and/or mechanical components comprising the control and/or driving circuitry and/or components for providing motion to and/or adjusting the position of a micromirror device. In one embodiment, a device layer comprises components known in the art of micromirror fabrication.

"Exposed surface area" refers to the area of an object which directly receives electromagnetic radiation when illuminated by a radiation source. In some embodiments, the exposed surface area of an object includes regions which are covered by a reflective layer which receives electromagnetic radiation directly from a radiation source. For example, the exposed surface area of a mirror base includes regions of the mirror base which are directly exposed to electromagnetic radiation from a radiation source and regions of the mirror base which are covered by a reflective layer which is also directly exposed to electromagnetic radiation from the radiation source. In certain embodiments, the exposed surface area of an object excludes the surface area of the object which is not directly illuminated by a radiation source (i.e., surface area which only receives indirect and/or reflected radiation from the radiation source). In a specific embodiment, the exposed surface area of a planar object, such as a mirror base, refers to the area of one side of the object (termed the front side) but excludes the surface area of the opposite side of the object (termed the back side). In a specific embodiment, the exposed surface area refers to the surface area of a polymeric mirror base.

"Resistive heating element" refers to a conductive material which generates heat when a current is passed through the material. In certain embodiments, resistive heating elements comprise conductive materials known in the art of microfabrication.

"Micromirror array" refers to a spatial arrangement of multiple micromirror device elements. In an embodiment, a micromirror array is useful as a reflective pattern generator for use in maskless photolithography systems and display devices.

"Sacrificial layer" refers to a layer or portion of a device which is removed during or after the fabrication of the device, for example by dissolution, etching, or other removal methods. Useful sacrificial layers include those layers comprising a material selected from the group consisting of: photoresist, polymer, metal oxide and dielectric, and any combination of these. Useful sacrificial layers also include layers comprising a material which can be removed without damaging other structural or functional layers.

The micromirrors and micromirror arrays described herein are useful, for example in maskless photolithography systems and methods and projection display devices and methods. According to one aspect, the micromirrors comprise a polymer structural layer and a reflective dielectric multilayer for selective reflection and/or redirection of incoming electromagnetic radiation. According to another aspect, incorporation of a reflective dielectric multilayer allows for use of polymer structural materials in micromirrors and prevents damage to such polymer materials due to excessive heating from absorption of electromagnetic radiation, as the reflective dielectric multilayers are highly reflective and minimize heating of the micromirror components. According to yet a further aspect, top down fabrication methods are described herein for making a micromirror comprising a polymer structural layer and a reflective dielectric multilayer.

Figure 4:
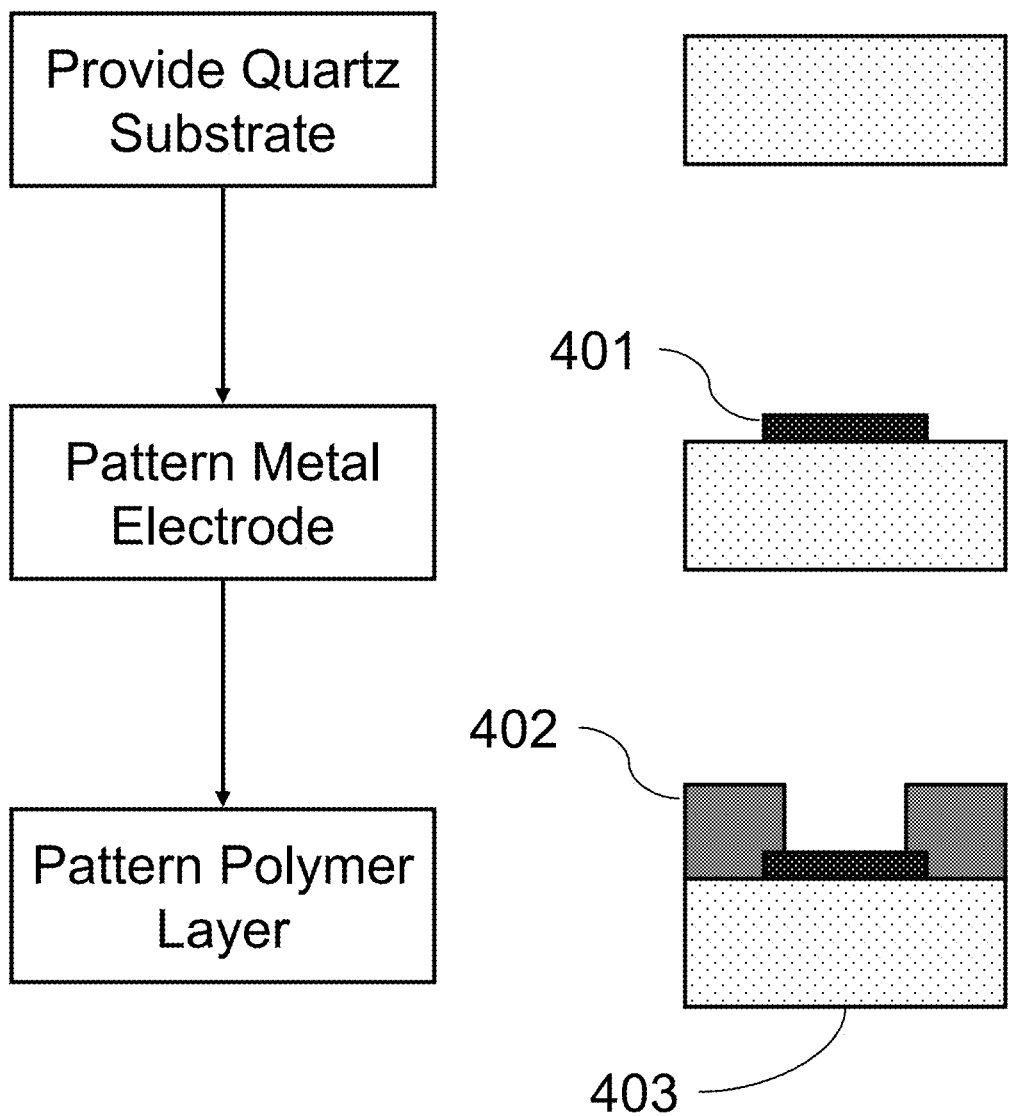
FIGS. 4, 5 and 6 illustrate a top down method for making a micromirror.
Figure 5:
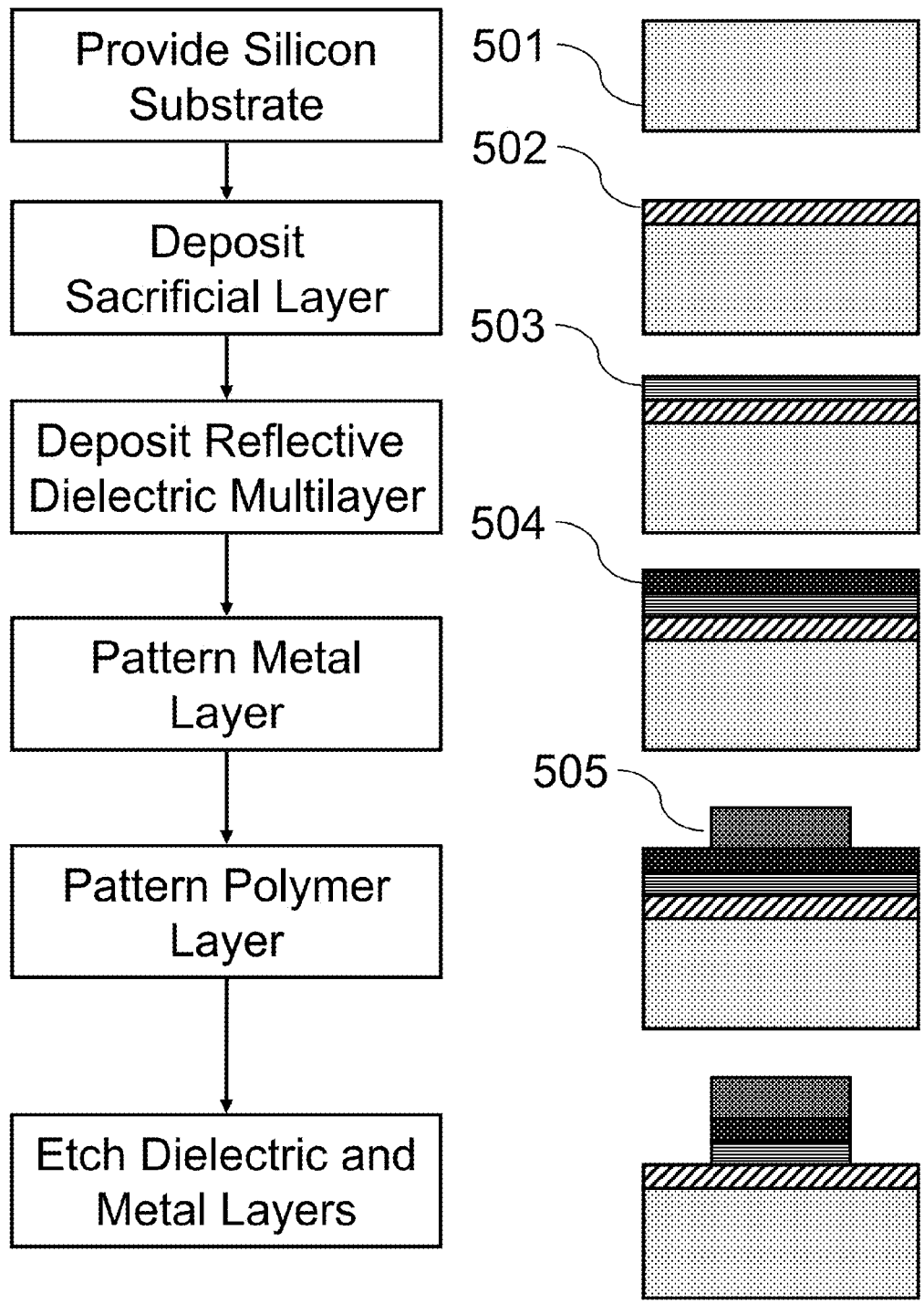
Figure 6:
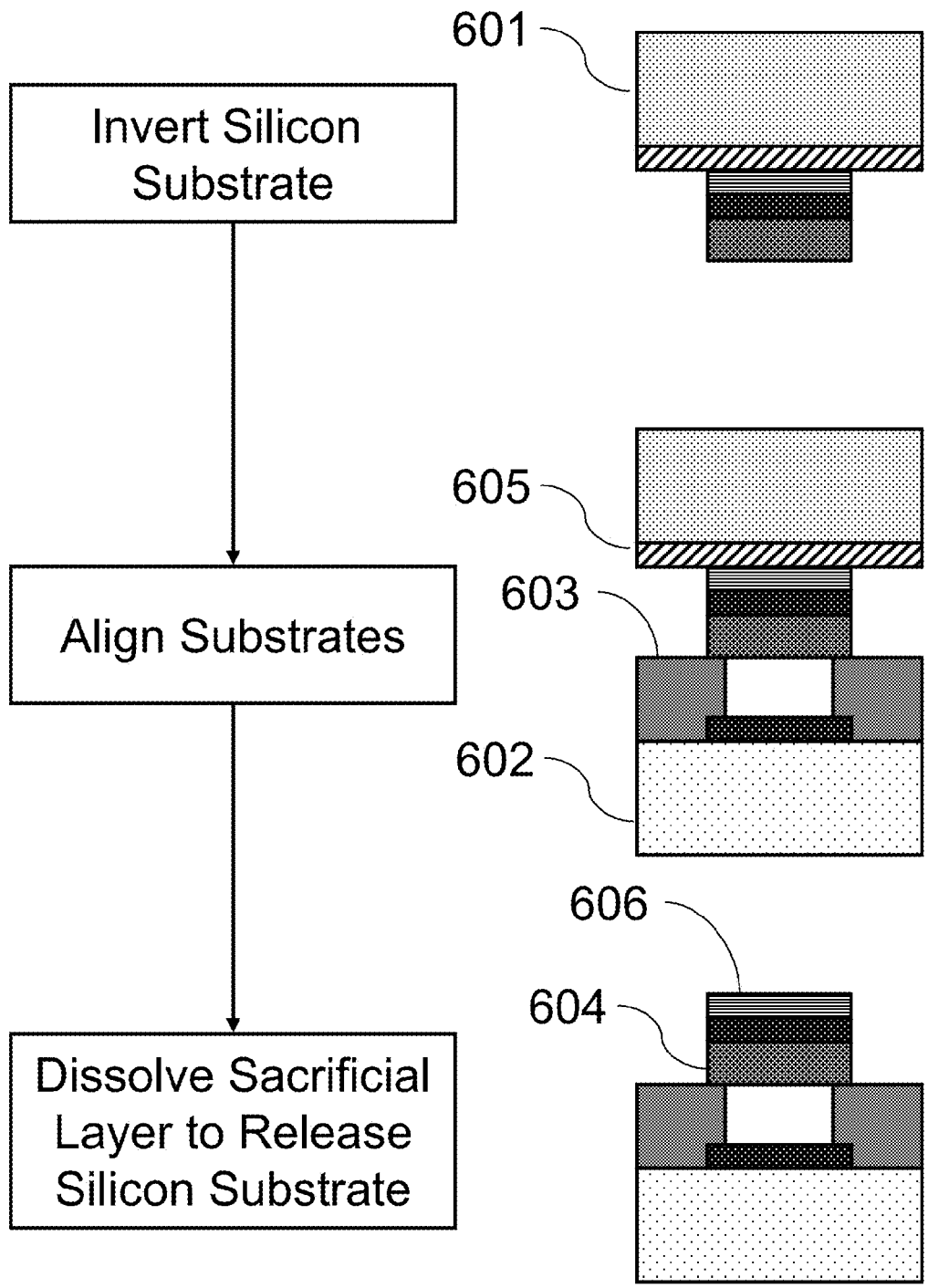

FIGS. 4, 5 and 6 illustrate a top down fabrication method for a micromirror embodiment. FIG. 4 shows patterning of a metal electrode 401 and polymer layer 402 over a quartz substrate 403. In embodiments, the metal is aluminum. In embodiments the polymer is SU-8 (photoresist). A silicon substrate 501, shown in FIG. 5 is provided with sacrificial layer 502 and reflective dielectric multilayer 503 before patterning of a metal layer 504. A polymer layer 505 is then patterned over the metal layer. In embodiments, the sacrificial layer is OmniCoat, the polymer layer is HD-8820 (polyimide) and/or the metal layer is aluminum. After patterning of polymer layer 505, the reflective dielectric multilayer 503 and metal layer 504 are etched. FIG. 6 illustrates the assembly process of the micromirror. The silicon substrate 601 is inverted and aligned over the patterned quartz substrate 602 and stamped to adhere the polymer layers 603 and 604. Sacrificial layer 605 is then removed to release the silicon substrate 601, exposing the reflective dielectric multilayer 606.

Figure 7:
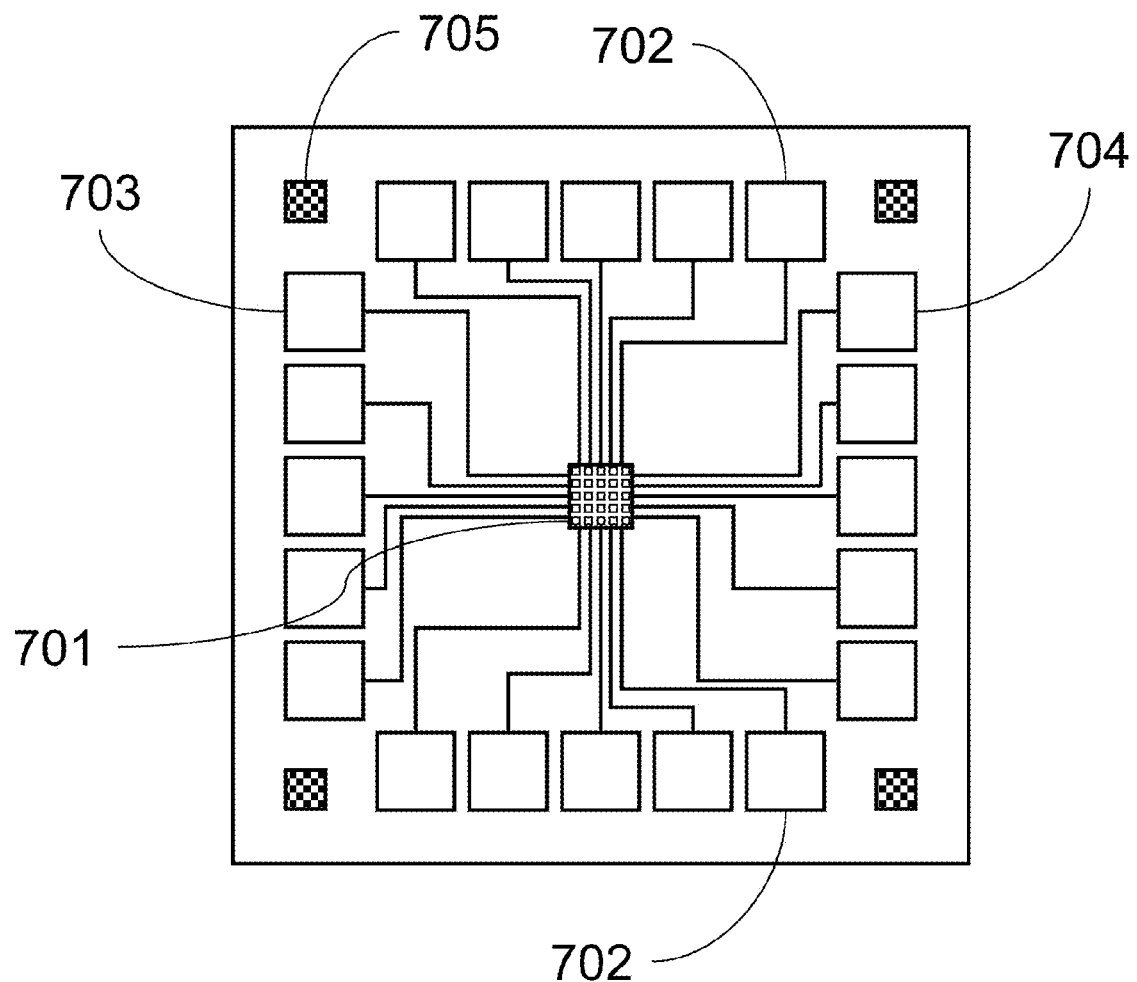
FIG. 7 shows a 5×5 micromirror array design scheme.

FIG. 7 shows the design of a 5×5 micromirror array embodiment 701 and connection circuitry. Connection pad 702 is used to connect to the mirror body electrode. In this construction, both the corresponding top and bottom connection pads are connected to a single mirror column for easy circuitry. Connection pad 703 is used for connecting a voltage to the actuating electrode for mirror position adjustment. Connection pad 704 is used for connecting a voltage to the restoring electrode for mirror position adjustment. Alignment keys 705 are also provided on this embodiment.

Figure 8:
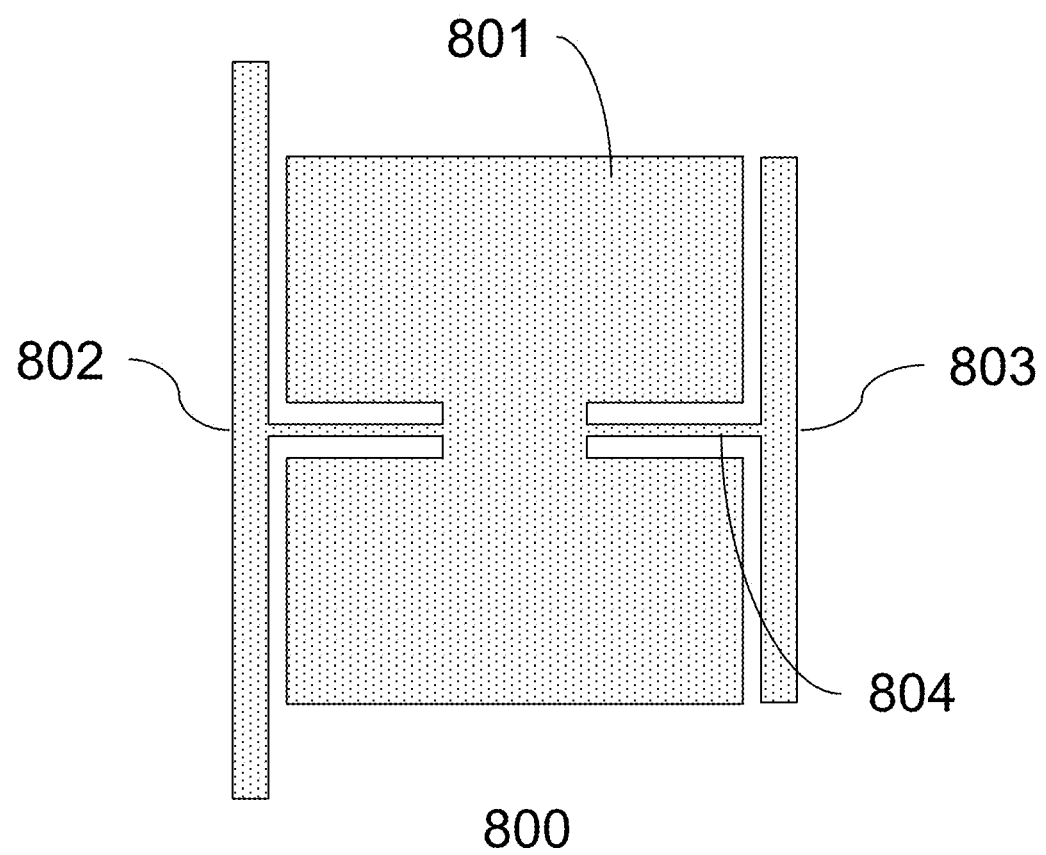
FIG. 8 shows a micromirror design.

FIG. 8 shows the design of a single micromirror embodiment 800. Mirror surface 801 is exposed to radiation for reflection and/or redirection. Two anchors 802 and 803 are shown for securing and supporting the micromirror. Anchor 802 further includes electrical connections to the mirror body electrode. A torsion bar 804 has the minimum feature size in this embodiment, for example 5 μm×100 μm.

Figure 9:
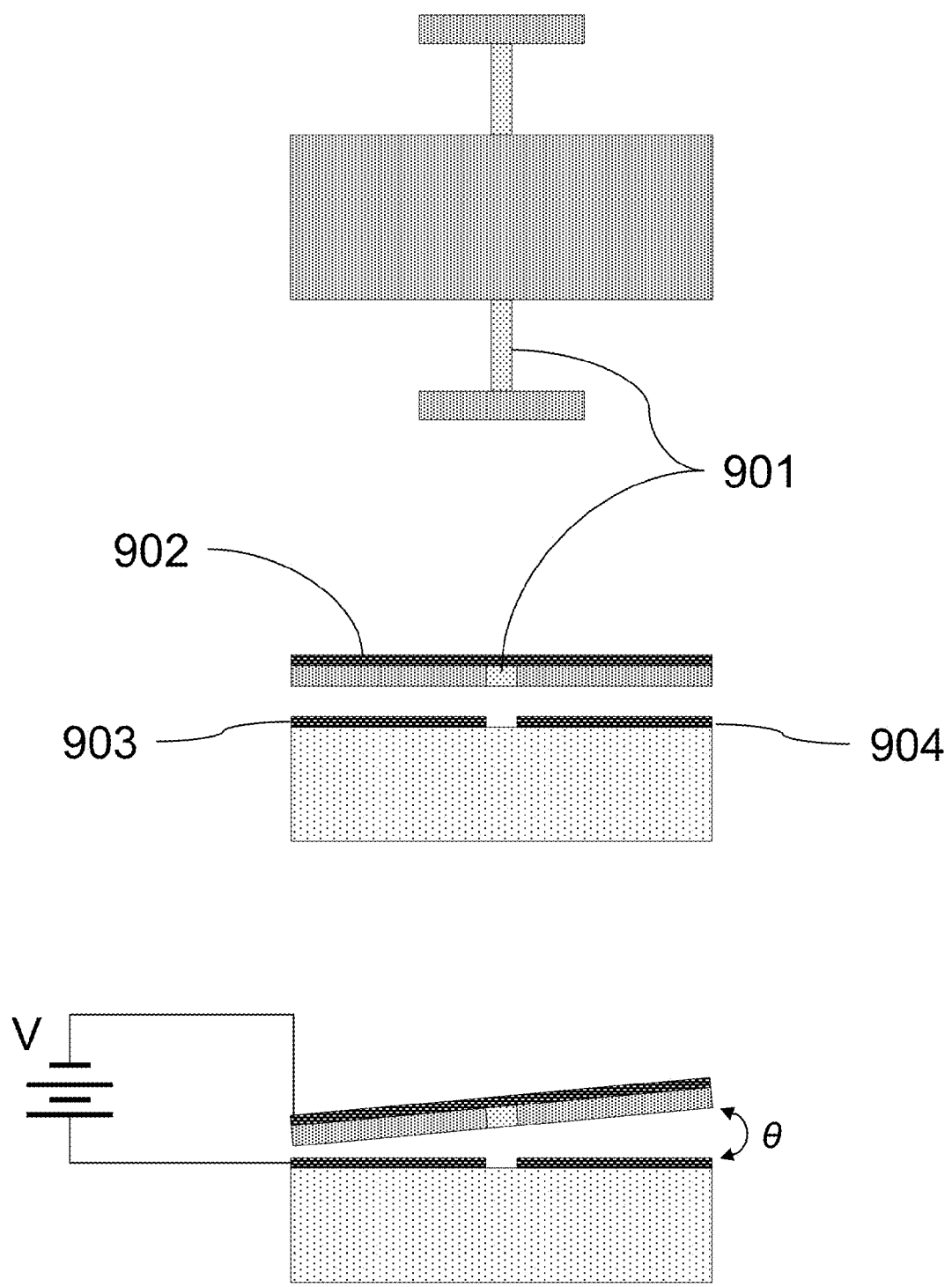
FIG. 9 illustrates the operation of a micromirror.

FIG. 9 shows another micromirror embodiment. Here, the micromirror is supported by two anchors and a torsion bar 901. The mirror body electrode 902 faces opposite to actuating electrode 903 and restoring electrode 904. When a voltage V is applied across the mirror body electrode 902 and actuating electrode 903, the mirror surface pivots around torsion bar 901 to angle θ. For clarity, no reflective dielectric multilayer is shown in this embodiment.

Figure 10:
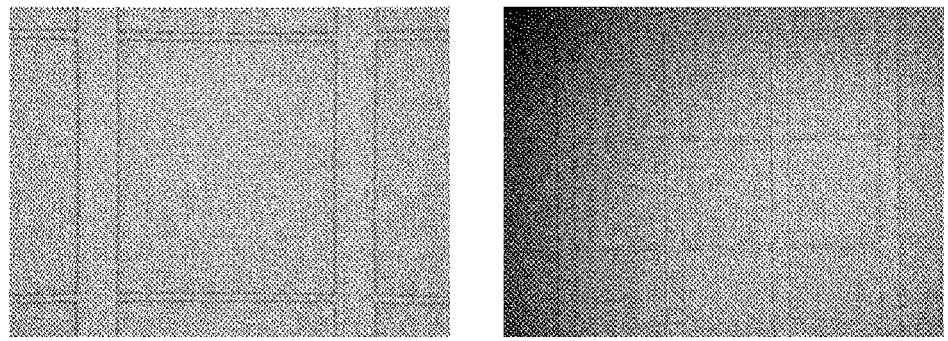
FIG. 10 shows images of patterned polymer.
Figure 11:
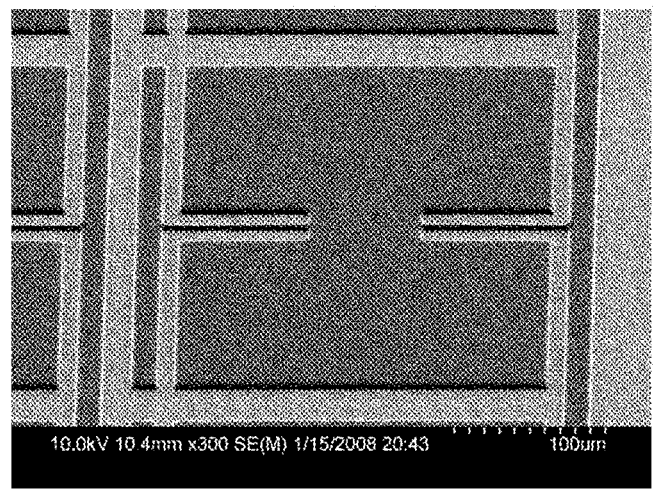
FIG. 11 shows images of patterned polymer.

FIG. 10 shows two images of patterned SU-8, useful for some embodiments as the mirror base. FIG. 11 shows an image of patterned HD-8820, useful for some embodiments as mirror anchor supports and other components.

Figure 12:
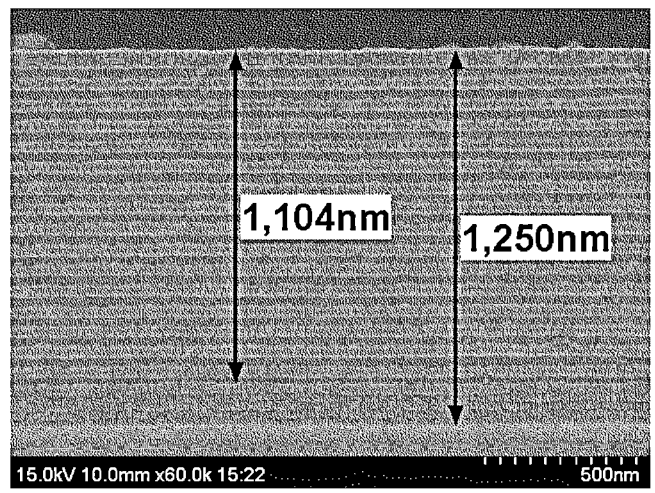
FIG. 12 shows images of a reflective dielectric multilayer.
Figure 12:
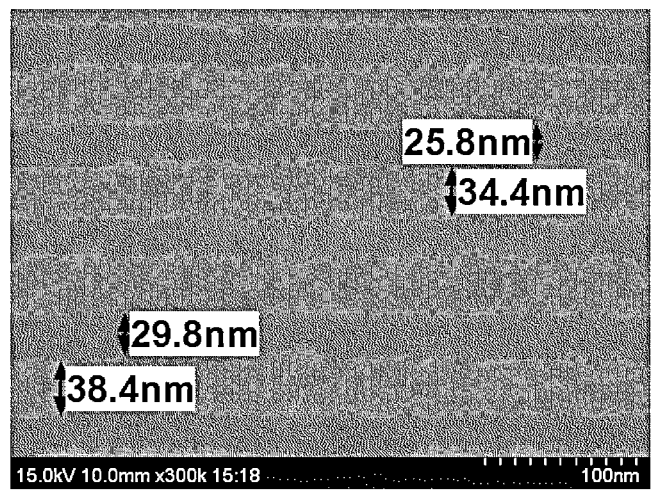

The fabrication of the reflective dielectric multilayer for one embodiment was specified to have greater than 90% reflectivity at 248 nm at a 5 degree angle of incidence. SEM cross-sectional images of the resulting reflective dielectric multilayer, shown in FIG. 12, reveal that there is an approximately 1.1 μm dielectric stack deposited on the silicon substrate. Reflectivity measurements indicate reflectivity is 98.9% at 6 degrees angle of incidence. For comparison, the silicon substrate is only 65.6% reflective at the same angle.

Figure 13:
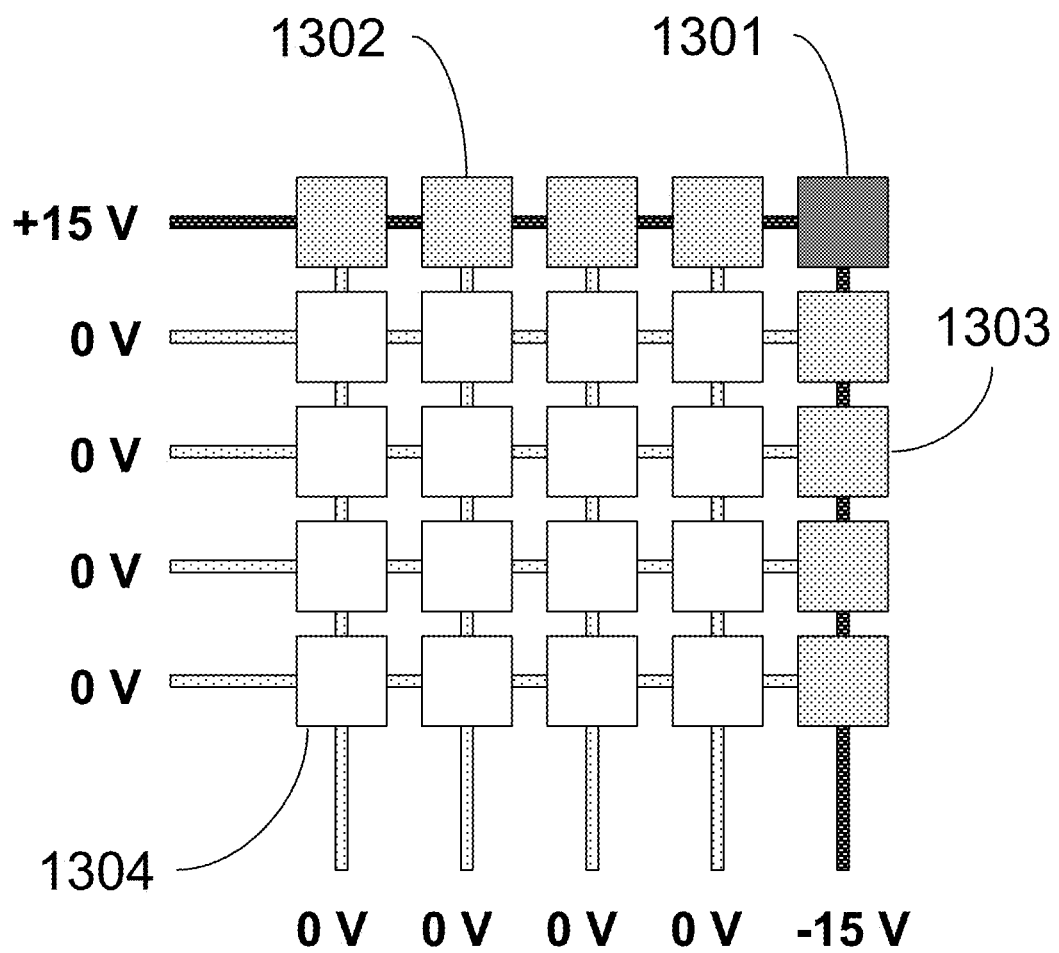
FIG. 13 illustrates the control circuitry for a 5×5 micromirror array.

FIG. 13 shows a control circuit embodiment for a 5×5 micromirror array. The top rightmost micromirror 1301 in this configuration has a potential difference of 30 V between the mirror body electrode and actuating electrode, resulting in full deflection of micromirror 1301. In comparison, micromirrors 1302 and 1303 have only a 15 V potential difference, resulting in a deflection of less than 1 degree. Other micromirrors 1304 have a potential difference of zero and have no deflection. Driving circuitry for the 5×5 micromirror array uses a NI-DAQ (National Instruments Data Acquisition) system as well as LabView program to drive the digital inputs to the micromirror. Outputs of the NI-DAQ are fed through a unity gain buffer and a relay to switch the high voltage actuation.

The invention may be further understood by the following non-limiting examples.

EXAMPLE 1

Digital Micromirror Devices and Use of Dielectric Reflectors

Figure 14:
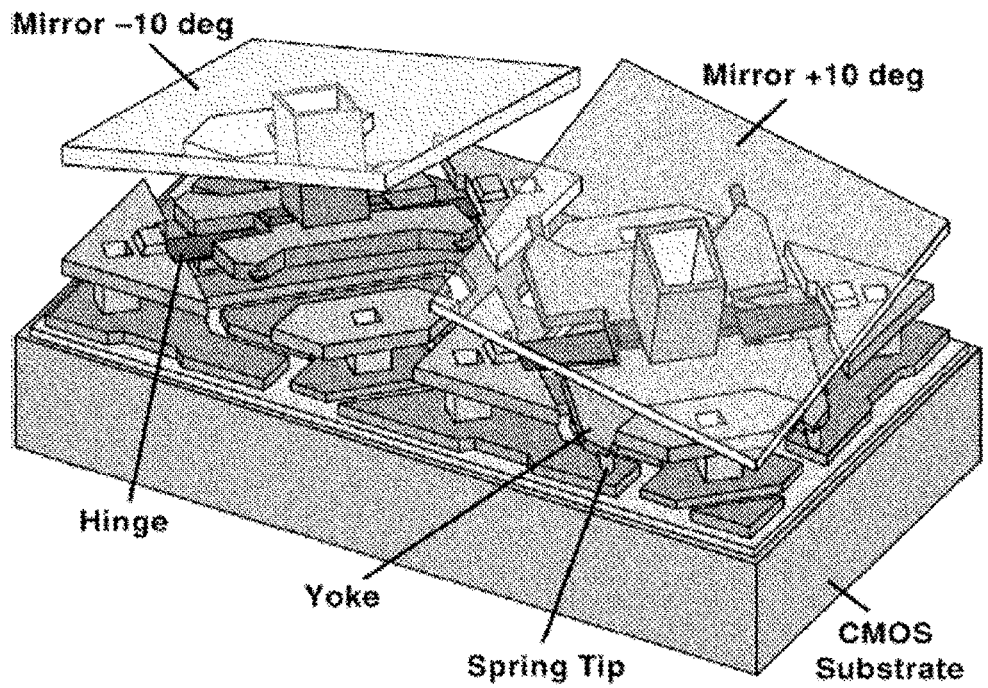
FIG. 14 shows the components of a micromirror and an electron micrograph image of a micromirror array.
Figure 14:
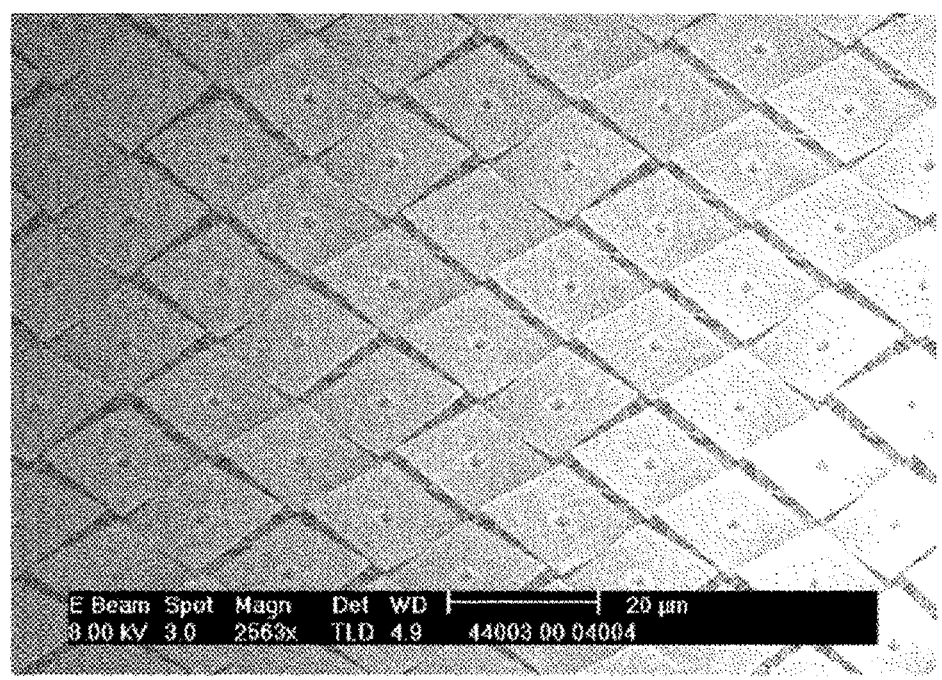

Micromirror arrays were researched during the 1980s for the optical purposes such as light processing, image display, and optical switches. One of the applications of micromirror arrays is the DMD (digital micromirror device, Texas Instruments) for DLP (Digital Light Processing) projection systems. A DMD is made of approximately one million micromirrors, which reflect light in the intended directions under the control of a processor. By controlling the reflection of each mirror, a projection image is generated after some optical systems. FIG. 14 shows a schematic illustration of a DMD device and its SEM image (M. Douglass, Reliability testing and characterization of MEMS/MOEMS II, Proceedings of SPIE vol. 4980, 2003). The micromirror arrays in the DMD chip are fabricated by a microfabrication process.

DMD arrays are useful as light modulators for projection display products. There, white light is illuminated on the DMD and the light is reflected. In order to make a bright projected image, high intensity illumination is required on the micromirror arrays. As an example, if the projected image requires 500 nit of brightness and the area magnification ratio is 10, the intensity on the micromirror arrays should be 5000 nit. As another example, if the projected image requires 500 nit of brightness and the length magnification ratio is 10, an intensity of 50000 nit will be needed at the micromirror arrays. When the DMD arrays are illuminated by such high intensity light source, the DMD will be heat up readily because some of the illumination is absorbed by DMD mirror. The DMD array can have reliability problems in such an environment.

In the fabrication of a mirror for optical components, a dielectric multilayer is commonly coated on the surface of the lens, glass, fused silica (quartz) and other kinds of optical materials. By carefully choosing the type and thickness of the dielectric layers on the optical materials, a mirror can have the desired reflectivity at the desired wavelength of light. One of the problems of the conventional DMD is that the aluminum micromirrors can be damaged during high intensity illumination from the resulting heat. If a dielectric layer is coated on top of the micromirror structures, the micromirror structures will not be damaged because the new micromirrors will have a higher reflectivity for the incoming light. The resulting heat at the micromirrors will decrease so that damage of the micromirror structures will be eliminated.

With reflectivities close to 100%, micromirror structures can be used even with high illumination intensity. Also, additional functions may be introduced with the use of a dielectric layer. The image by micromirror arrays becomes much sharper, and the image produced by the micromirror arrays can have many more colors than what is currently capable.

EXAMPLE 2

Micromirror Arrays for High Fluence Conditions Using Dielectrics

Conventional micromirrors are fabricated on a silicon substrate, and a metal such as aluminum, or gold is used as a mirror layer. The metal itself can be the structural material of the whole micromirror or can be coated on top of another structural material. However, if the illumination intensity increases beyond a particular threshold, the metal layer and/ or the entire mirror structure can be damaged by absorbed heat. Therefore, the illumination intensity limits the application of the micromirror arrays.

Use of a high reflectivity dielectric coating on top of the mirror structure or on top of the metal mirror limits the amount of heat absorbed by the mirror. Accordingly, the illumination intensity on the micromirror can be increased further. With higher useful illumination intensities on micromirror structures, the application of micromirrors can be broadened.

In the use of micromirrors for display products such as a DLP projector, the display intensity can be increased to produce higher quality display images. An increase in the intensity of illumination for maskless lithography will decrease the required process time for PR exposure, increasing the efficiency and usability of the maskless lithography process.

EXAMPLE 3

Polymer Micromirror Arrays for High Fluence Conditions Using Dielectrics

In the fabrication of conventional micromirror structures, reflective metal layers are deposited on top of the mirror structures to gain higher reflectivity. Silicon, aluminum or other kinds of solid materials are used for the structure of micromirror arrays. However, the most common way to deposit such materials is sputtering or chemical vapor deposition (CVD), which requires expensive vacuum equipment, long process times, frequent maintenance and expensive precursors. In order to pattern the metal layer, a wet etch system with metal etchant is generally required.

Polymer materials can be used as structural members of micromirrors, reducing the production costs because the process can be simplified. For the coating of the polymer material, spin coating and baking processes can be readily used which are much faster and cheaper. The equipment used in such processes is also much cheaper than the common vacuum deposition system. For the patterning of the polymer structures, a conventional dry etching process can be used. In some special polymers, the polymer can be patterned during the photolithography process so that the process can be simplified much more.

As described above, heat absorption by the mirror structures can be minimized by coating a reflective dielectric layer on top of the mirror structure. Therefore, even though polymers are more vulnerable to heat than inorganic materials, the reduction in heat due to use of a dielectric reflective layer enables the use of polymer materials as structural materials for micromirror arrays. This will further decrease the production cost for micromirror arrays.

EXAMPLE 4

Use of Micromirror Arrays in Maskless Photolithography

Figure 15:
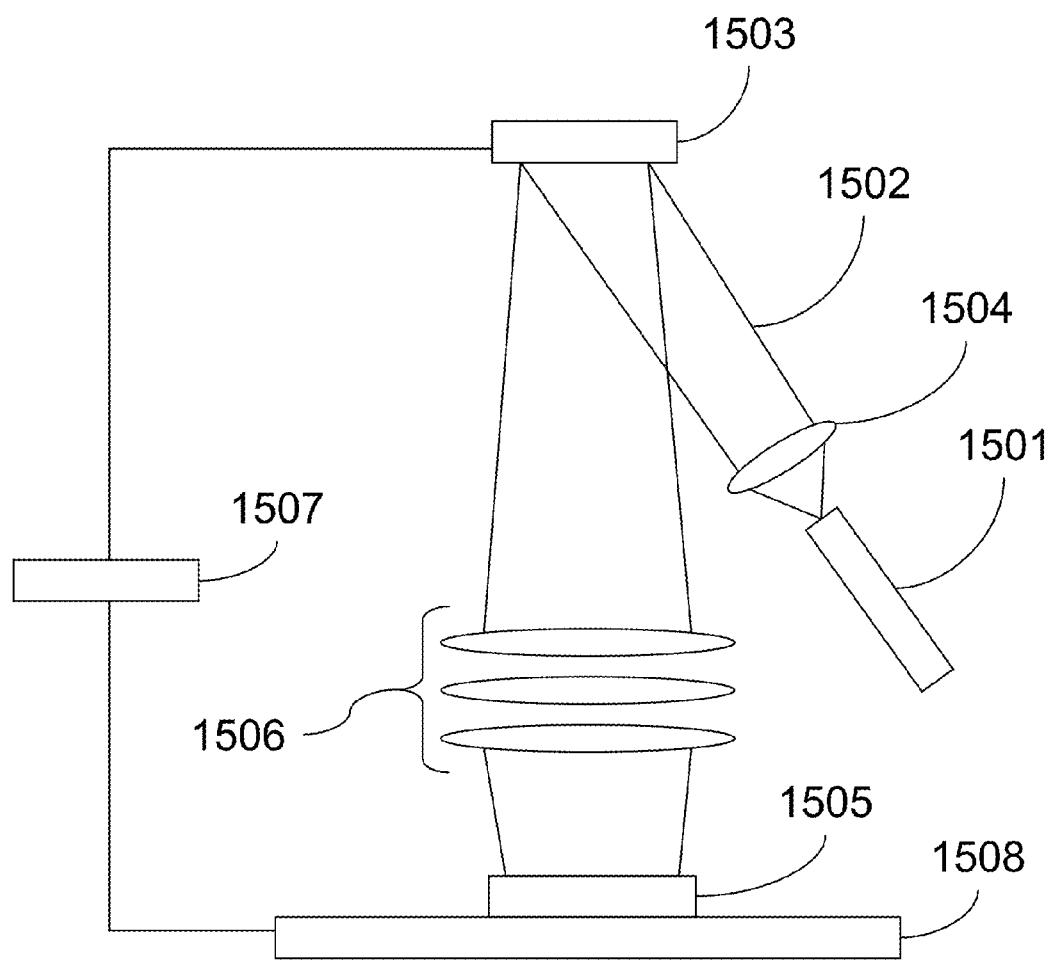
FIG. 15 illustrates operation of a micromirror array in a maskless lithography process.

The basic role of the micromirror array is to make an image under the control of a processor, and this concept was introduced to the photolithography process. When the light source is illuminated on micromirror arrays and the micromirror makes a controlled image, the photoresist on the substrate can be exposed selectively without a photomask. This concept is illustrated in FIG. 15.

From a radiation source 1501, electromagnetic radiation 1502 is illuminated on the mirror array 1503 through an optical lens system 1504. The micromirror array reflects illumination selectively so that an image is made on top of the substrate 1505 using the optical lens system 1506. A controller unit 1507 controls the position of the substrate holder 1508 and the reflections from the micromirror array 1503. In this system, photoresist on top of the substrate can be exposed on the desired area so that a photomask is not needed to make patterns on the substrate. If another set of patterns is required for device fabrication, the controller unit 1507 can control the micromirror arrays 1503 so a different image is exposed on the substrate 1505. The control unit can also easily generate new patterns if design revisions and modifications are needed. Use of this maskless system in device fabrication reduces the cost of production because expensive photomasks are not needed.

The DMD micromirror is a MEMS-based electrostatic actuator that is based on the following principles:

Electrostatic Torque:

As voltage is applied to the top and bottom electrodes of the micromirror opposite charges collect on electrodes imparting an attractive electrostatic force. The electrostatic force can be expressed by:

$$F = \frac{1}{2}\frac{C \cdot V^2}{d}$$

Thus, the electrostatic force is dependent on the capacitance of the electrodes C, which is dependent on the surface area, the distance between the two electrodes, and the dielectric permittivity constant. The electrostatic torque can be calculated from the electrostatic force by calculating the differential capacitance dC per given distance x away from the pivot point and integrating for length l of the electrode.

$$\tau_e(V) = \int_0^l \frac{1}{2}\frac{dC \cdot V^2}{d}x$$

Mechanical Restoring Torque:

There is a rod in the micromirror which acts in a similar manner as a torsion spring. The restoring torque can be calculated by $\tau_m(\theta) = \theta K G$ where K is the spring constant, G is the bulk modulus of the material, and $\theta$ is the angle between micromirror and the neutral position.

Equilibrium:

The amount that the micromirror is tilted is determined by the equilibrium position of the system where the mechanical restoring torque is equal to the electrostatic torque. However, in most DMD designs, it is advantageous for the micromirror to "tilt" a predetermined angle. Therefore, it is important to determine the "pull-in voltage" of the micromirror; "pull-in voltage" is the voltage where the electrostatic torque exceeds the mechanical restoring torque for all movable angles of the micromirror. By applying a voltage across the electrodes greater than the pull-in voltage, the micromirror can be fully deflected to its maximum angle.

In constructing a mathematical model, useful parameters include the pull-in voltage, the resonant frequency, and maximum stress of the micromirror. It is advantageous to minimize the pull-in voltage and stress while maximizing the resonant frequency. Various parameters such as rod shape (length, width, and height), as well as the micromirror shape and size (surface area, and height) are parameters that can be optimized to produce the optimal micromirror design. The micromirror was also modeled using Finite Element Analysis (FEA) for several different configurations to confirm the mathematical analysis, confirm the resonant frequency, and also examine the stresses and strains on the design.

EXAMPLE 5

Design and Fabrication of Polymer Micromirrors

Design.

Based on the capacitive driving principles explained in the previous example, an analytical model was developed to optimize the size of the torsion bars (length, width, and height), the size of the micromirrors, and the thickness of the polymer. The theoretical resonant frequency was also determined to determine the maximum driving frequency.

The mechanical characteristics of the DMD mirror were verified using ANSYS Finite Element Analysis, and it was concluded that the stresses at the maximum deflection were less than the yield stress of the material. Based on analytical models and simulations, the dimensions for the micromirror array cell were determined.

Figure 16:
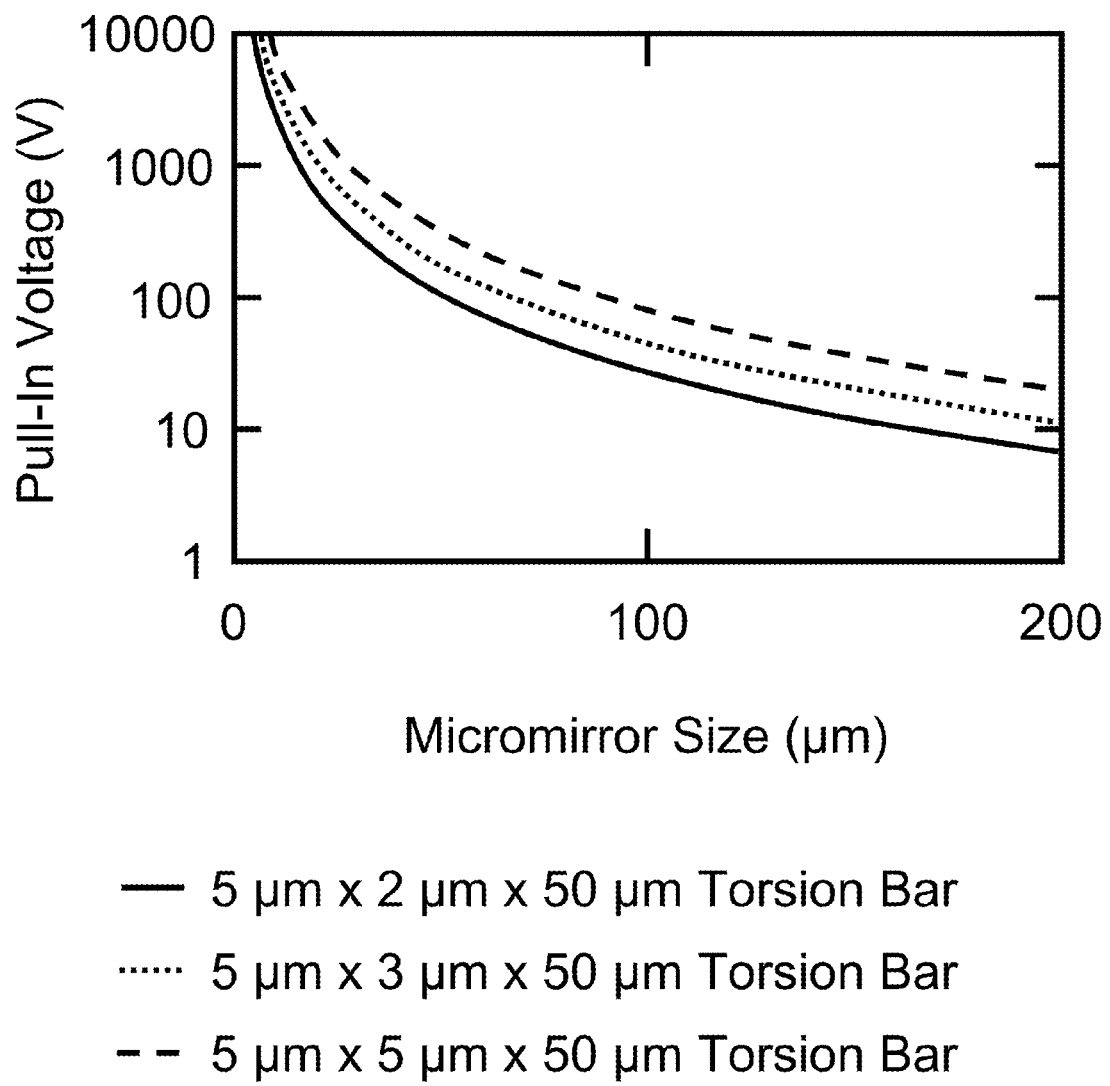
FIG. 16 shows data providing the pull-in voltage as a function of micromirror size for micromirrors having three different sized torsion bars.
Figure 17:
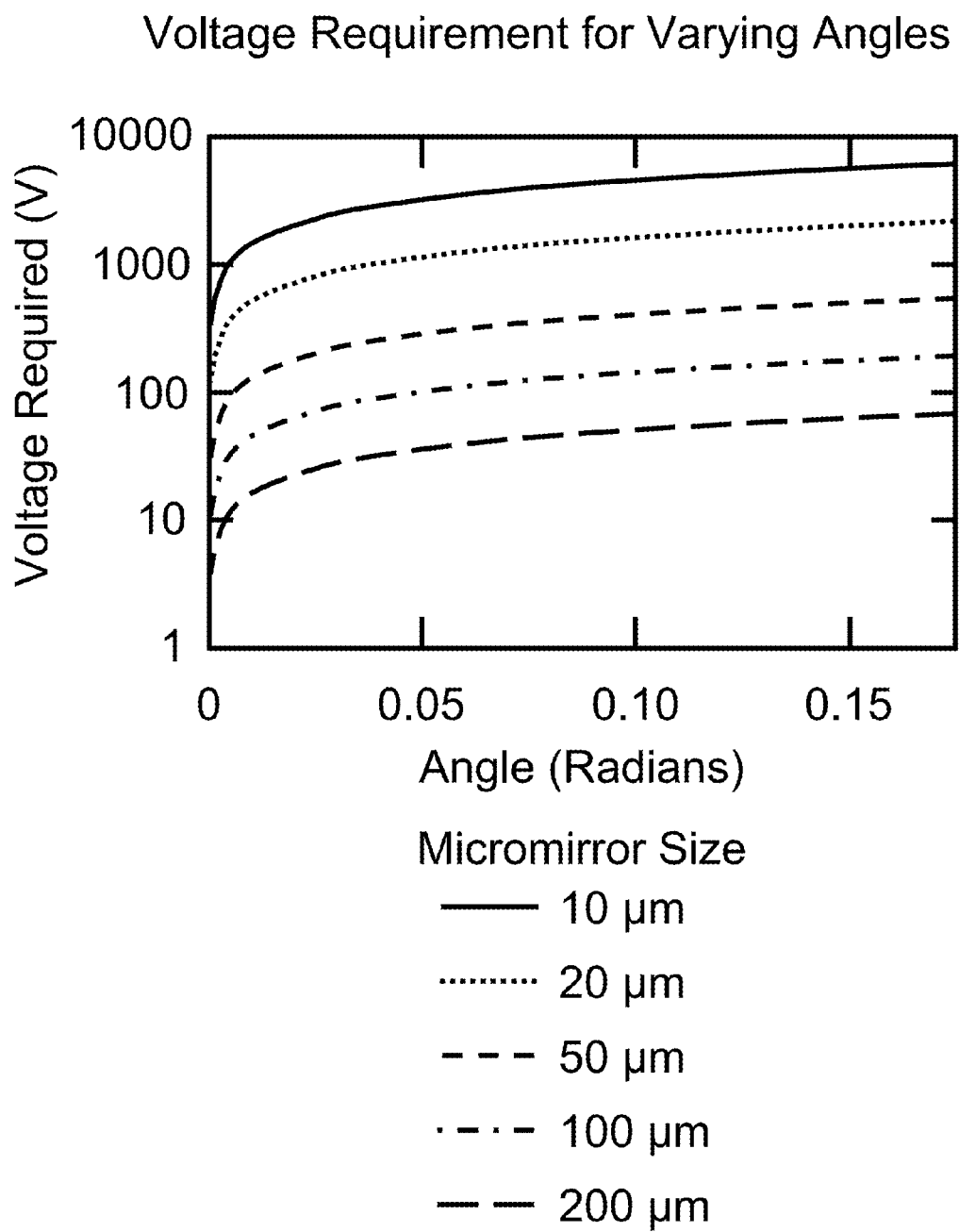
FIG. 17 shows data providing voltages required for angular deflection of a micromirror for 5 different micromirror sizes.

FIGS. 16 and 17 show the results of analytical models used for determining the pull-in voltage as a function of the torsion bar and micromirror characteristics. For a 100 µm×25 µm×5 µm mirror with a 5 µm×5 µm×100 µm torsion bar, a maximum stress established in the torsion beam is 4.27 MPa. A 10 µN force a 10 µN applied force to a 100 µm×25 µm×5 µm mirror with a 5 µm×5 µm×50 µm torsion bar resulted in a 4.28 µm vertical deflection of one end of the mirror.

Fabrication.

A top-down fabrication process was developed for the assembly of the micromirrors. The assembly process begins with a bottom quartz substrate and a top silicon substrate; both substrates are aligned and attached during the assembly process.

The fabrication process is detailed in FIGS. 4, 5 and 6. A quartz substrate has metal electrodes patterned thereon followed by patterning of a polymer, for example SU-8 (photoresist). A sacrificial layer is deposited over a second, silicon substrate. Over this, a reflective dielectric multilayer is provided, followed by patterning of metal and polymer layers, for example aluminum and HD-8820 (polyimide), respectively. Finally, the dielectric multilayer and metal layers are etched. This substrate is then aligned over the patterned quartz substrate. Once aligned, the structures are brought into contact and the sacrificial layer is dissolved to release the structure from the silicon substrate, exposing the reflective dielectric multilayer.

EXAMPLE 6

Phase Shift Mask Using Dielectric Coating

Figure 18:
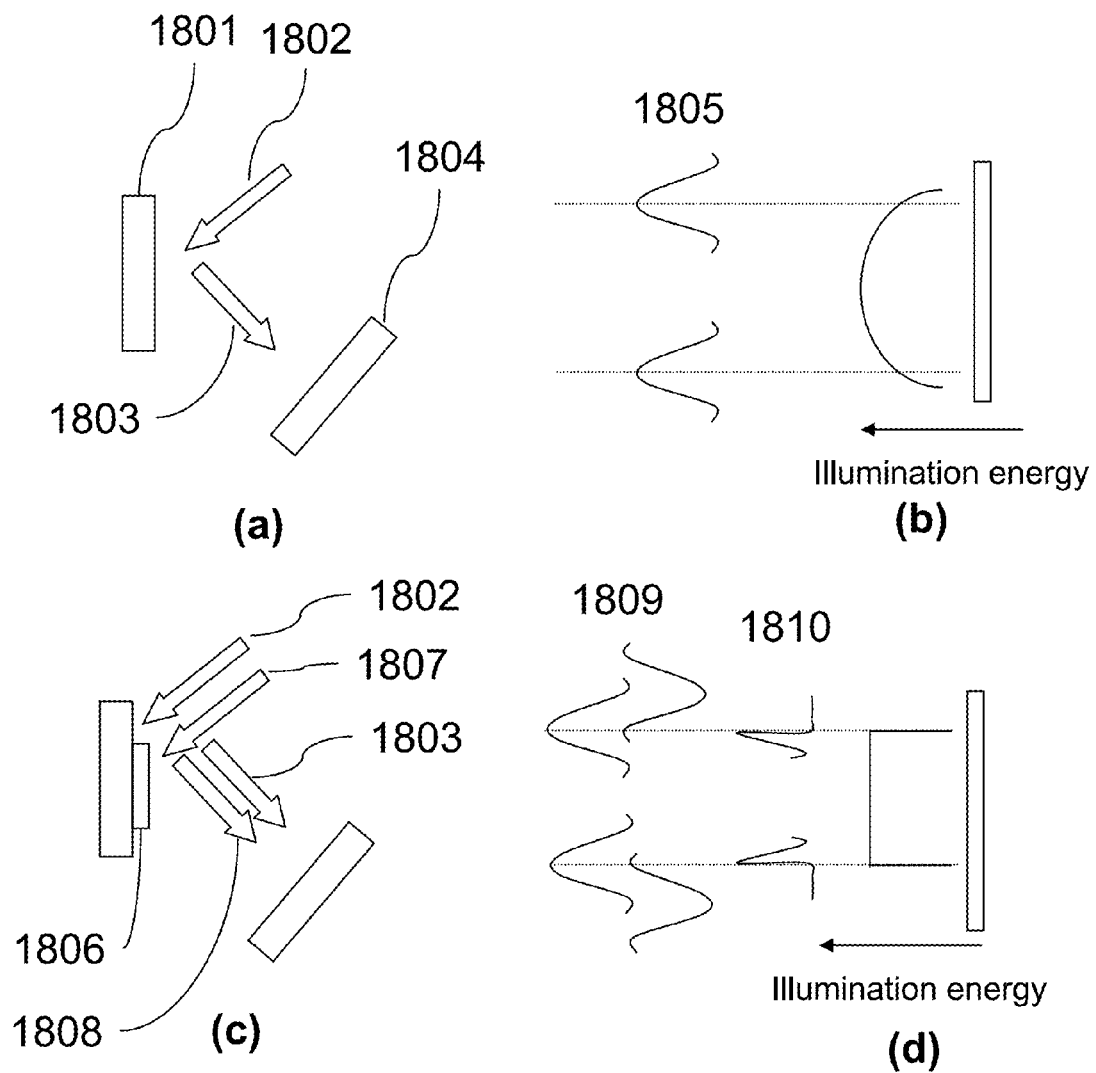
FIG. 18 illustrates the principles of a phase shift layer useful for providing high contrast reflections from a micromirror.

Phase shift masks use the interference phenomena generated by phase differences of adjacent light so that resolution enhancement in photoresist patterning is possible. Two common types of phase shift mask technology are alternating phase shift mask and attenuated phase shift mask. The phase shift concept can be used in the maskless lithography process if the phase interference can be realized by the dielectric coating on the micromirror surface of the micromirror arrays. FIG. 18 shows how the phase shift mask concept can be realized in the micromirror arrays. FIG. 18 (*a*) shows a conventional micromirror 1801 that reflects incoming light 1802. The reflected light 1803 illuminates the substrate 1804. FIG. 18 (*b*) shows the illumination intensity of light on the substrate 1804. At the edge of the reflected beam shape, the light wave has a Gaussian phase 1805 as shown in FIG. 18 (*b*). Due to the Gaussian profile of the light wave, the reflected light does not have a sharp edge so that a broad, diffuse interface is generated between illuminated area and non-illuminated area as FIG. 18 (b).

FIG. 18 (c) shows a micromirror of this aspect for making high contrast reflected images. The micromirror has an additional dielectric layer 1806 on top of the mirror surface. At the top edge of the unit mirror in FIG. 18 (c), are two incoming light sources 1802 and 1807 which are spatially adjacent with each other. Each incoming light source 1802 and 1807 generates two corresponding reflecting waves 1803 and 1808. Due to the thickness difference in the dielectric layer 1806 at the edge of the unit mirror, the two waves 1803 and 1808 are out of phase with each other. FIG. 18 (d) illustrates the phases 1809 of two reflecting waves. By summing the two phases 1809, a new light wave 1810 is generated and the new light wave makes high contrast images at the edges of the illuminated area as shown in FIG. 18 (d).

Figure 19:
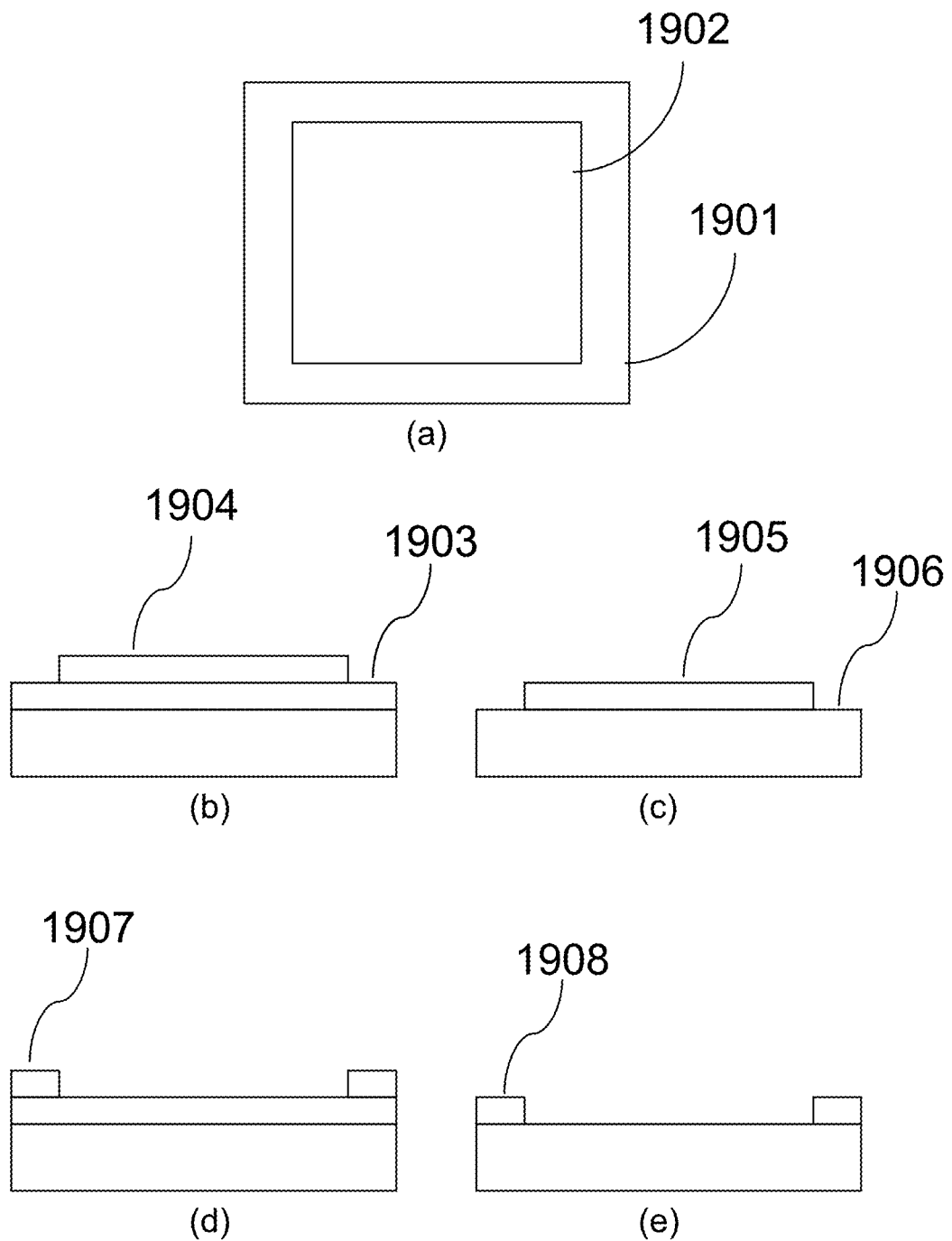
FIG. 19 illustrates designs for micromirrors for providing high contrast reflections.

FIG. 19 shows four types of phase shift micromirror embodiments on a unit mirror. FIG. 19 (a) shows a surface view of the unit mirror. The dielectric has different thicknesses between the outer area 1901 and the inner area 1902. FIGS. 19 (b) through (e) show cross sectional views of the four embodiments. An additional dielectric layer 1903 is placed on the first dielectric layer 1904 as shown in FIG. 19 (b). A dielectric layer 1905 smaller than the mirror structure 1906 can also be used, as shown in FIG. 19 (c). The light reflected at the dielectric 1905 and the mirror structure 1906 are out of phase such that destructive interference occurs at the projected image. As shown in FIG. 18 (d), additional dielectric layers 1907 can be placed in the outer area so that the outer area has thicker dielectric layers. Lastly, the dielectric layer 1908 can be placed only on the outer region, as shown in FIG. 19 (e).

With high contrast illumination by micromirrors, numerous benefits are achieved for the application of micromirror arrays. For micromirror arrays used in a DLP projector, a high quality image is generated because there is little mixing of color between adjacent color pixels. Use of high contrast illumination in the maskless lithography process results in high quality photolithography and/or fine patterning processes.

EXAMPLE 7

Sharp Turn Off by Dielectric Layer

In the driving of micromirror arrays, turning the illumination to on or off states is done by changing the reflecting angle on the micromirror. In the ideal case, there should be no light in the illuminating direction during the turn off state. However, although the micromirror is turned off, a small amount of light is directed to the 'on state' direction due to the rough surface morphology of a metal mirror. There could be some light leaking from the mirror due to the scattering on the metal mirror surface as shown in FIG. 20 (b).

Figure 20:
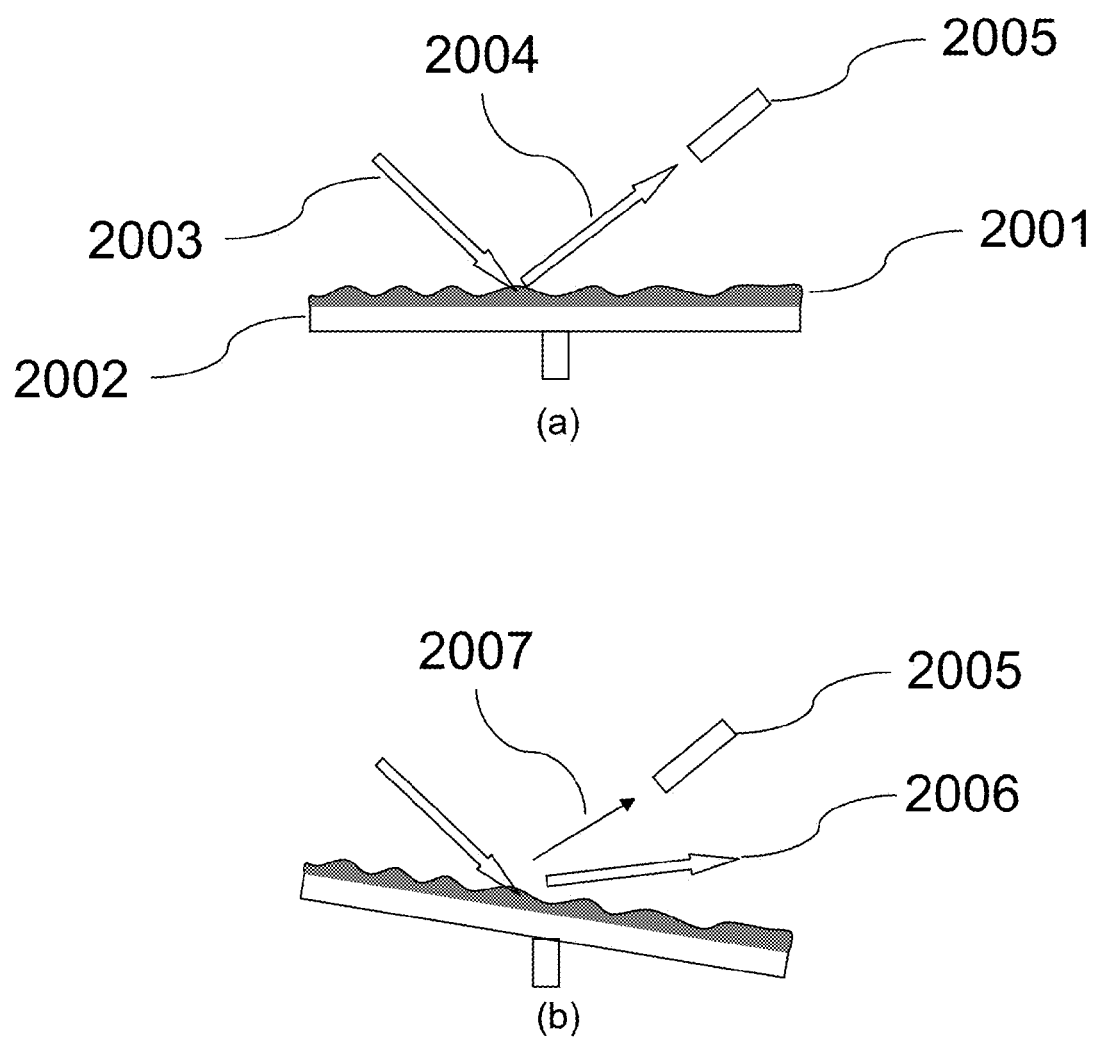
FIG. 20 illustrates reflection from a metal micromirror in on and off states.

FIG. 20 (a) shows typical micromirror, which uses aluminum as a mirror surface 2001 on the micromirror structure 2002; the morphology of the aluminum is exaggerated for illustration purposes. It is well known that as the thickness of aluminum increases, the surface morphology becomes rougher. Also, the morphology of typical metal is rougher than typical dielectric layer.

In the 'on' state of the micromirror in FIG. 20 (a), the incoming light 2003 is reflected from the mirror surface 2001 and the majority of the reflected light 2004 goes to the target position 2005. In the 'off' state of the micromirror shown in FIG. 20 (b), the reflected light 2006 goes outside of the target area 2005. However, there is small amount of light 2007 scattered from the surface of the metal 2001 so that the light contrast at the target position 2005 is decreased. The scattering of light 2007 comes from the fact that the morphology of the metal is not smooth in the dimension of the incoming light.

Figure 21:
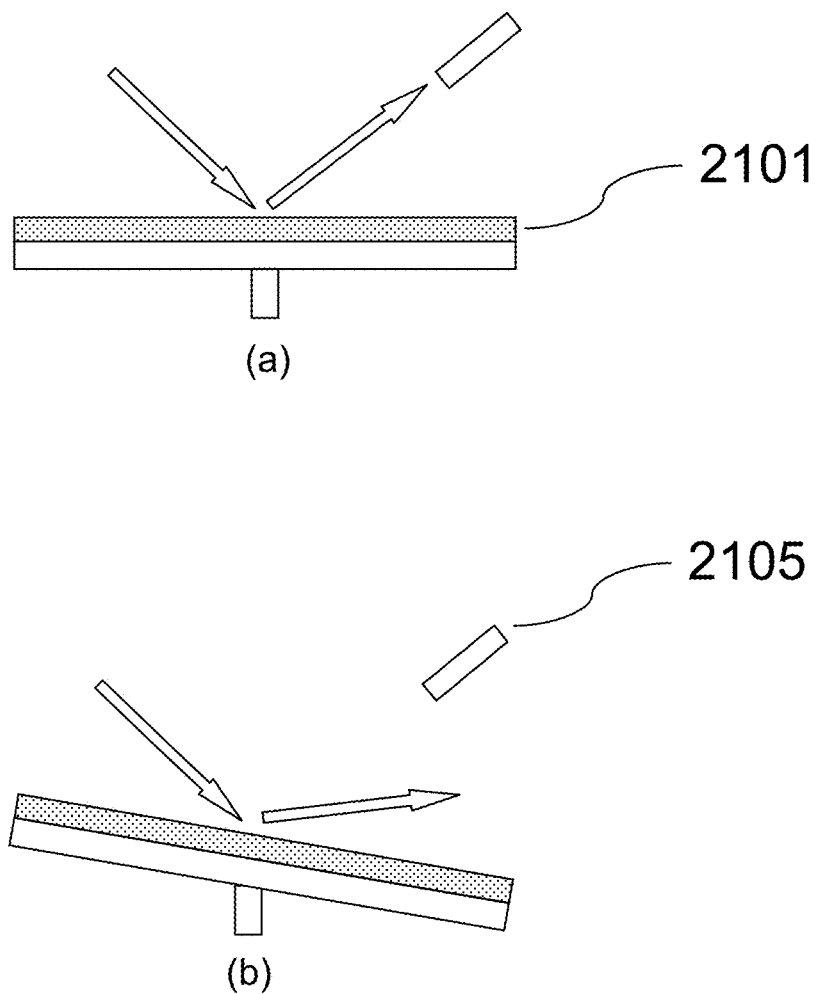
FIG. 21 illustrates reflection from a dielectric micromirror in on and off states.

When a dielectric layer 2101 is used as a mirror layer as shown in FIG. 21 (a), there is no major difference in the 'on' state of the micromirror compared to the case of the metal mirror layer. However, in the 'off' state of the micromirror as shown in FIG. 21 (b), there is less scattering of light so that the intensity contrast at the target position 2105 is increased.

EXAMPLE 8

Flexible Micromirror Arrays

Micromirror arrays can be fabricated on polymer substrates as well as conventional Si substrates. When micromirror arrays are fabricated on flexible substrates, the application of micromirror arrays and design freedoms increase.

For flexible micromirror arrays, the flexible substrate can be damaged by heat during high illumination because the substrate area between two adjacent micromirrors is exposed to incoming light. The micromirror is not damaged during the illumination due to its high reflectivity, but the substrate can be damaged easily because it may not feature a similar high reflectivity. U.S. Pat. No. 7,170,669 (K. Jain et al.) discloses a method for avoiding substrate damage by making a diffraction grating on the substrate and directing the incoming light away from both the substrate and the target. Combination of this feature with the micromirrors described herein allow for flexible micromirror arrays because both the mirror arrays and the substrates are free from heat damage due to high illumination intensities.

Figure 22:
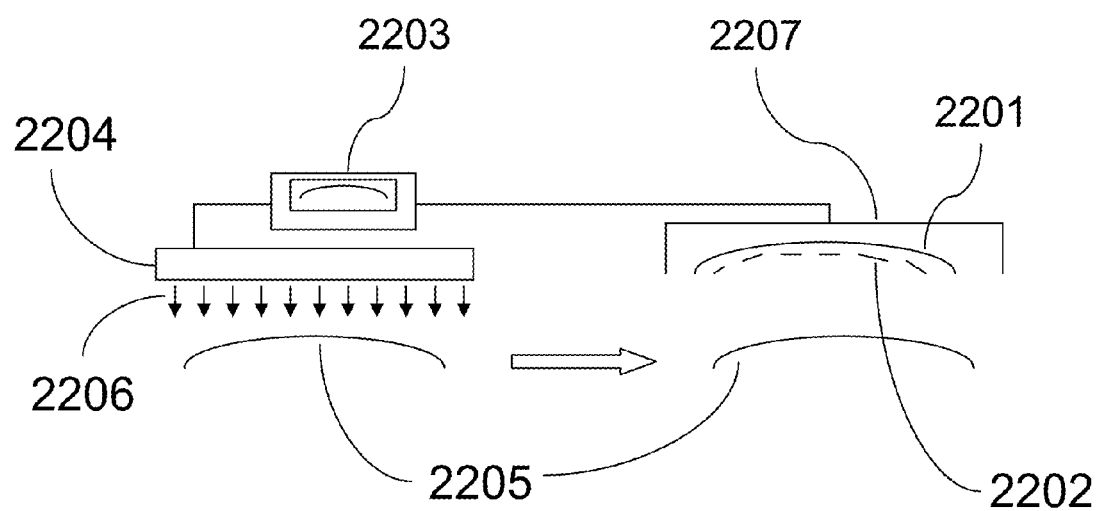
FIG. 22 illustrates a conformable maskless lithography system.

One of the applications for a flexible micromirror array is conformable maskless lithography. FIG. 22 illustrates one conformable maskless lithography embodiment. The maskless lithography system comprises a flexible mirror substrate 2201, micromirror array 2202, controller 2203 and height scanner 2204. In the fabrication of flexible electronics or microelectronic devices on the flexible substrate, the substrate 2205 may be nonplanar by design or it may be bent due to mechanical stress of the deposited thin film. If such a substrate is loaded in the maskless photolithography system, the height scanner 2204 determines the vertical deviation of the substrate using optical methods or other methods. In one embodiment, the scanner 2204 comprises a HeNe laser and an interferometer; the scanner 2204 determines the height using HeNe laser light 2206 and sends the height information to the controller 2203. The controller 2203 receives the height information and deforms the micromirror array. The curvature of the micromirror substrate 2201 is controlled mechanically by a deformer 2207 so that the curvature of the micromirror array 2202 is the same as that of the substrate 2205. After the micromirror array is deformed, substrate 2205 is loaded for exposure in a photolithography process.

Use of this process during maskless lithography solves the depth of focus problem encountered in the field of flexible electronics fabrication, flexible display fabrication, microelectronic device fabrication and flat panel display fabrication processes. For description of problems in maskless lithography when a curved substrate is used, and description of some possible solutions, see a US patent by Bjorklund & Jain (U.S. Pat. No. 6,707,534).

EXAMPLE 9

Thermal Compensation for Dielectric-Coated DMDs

Figure 23:
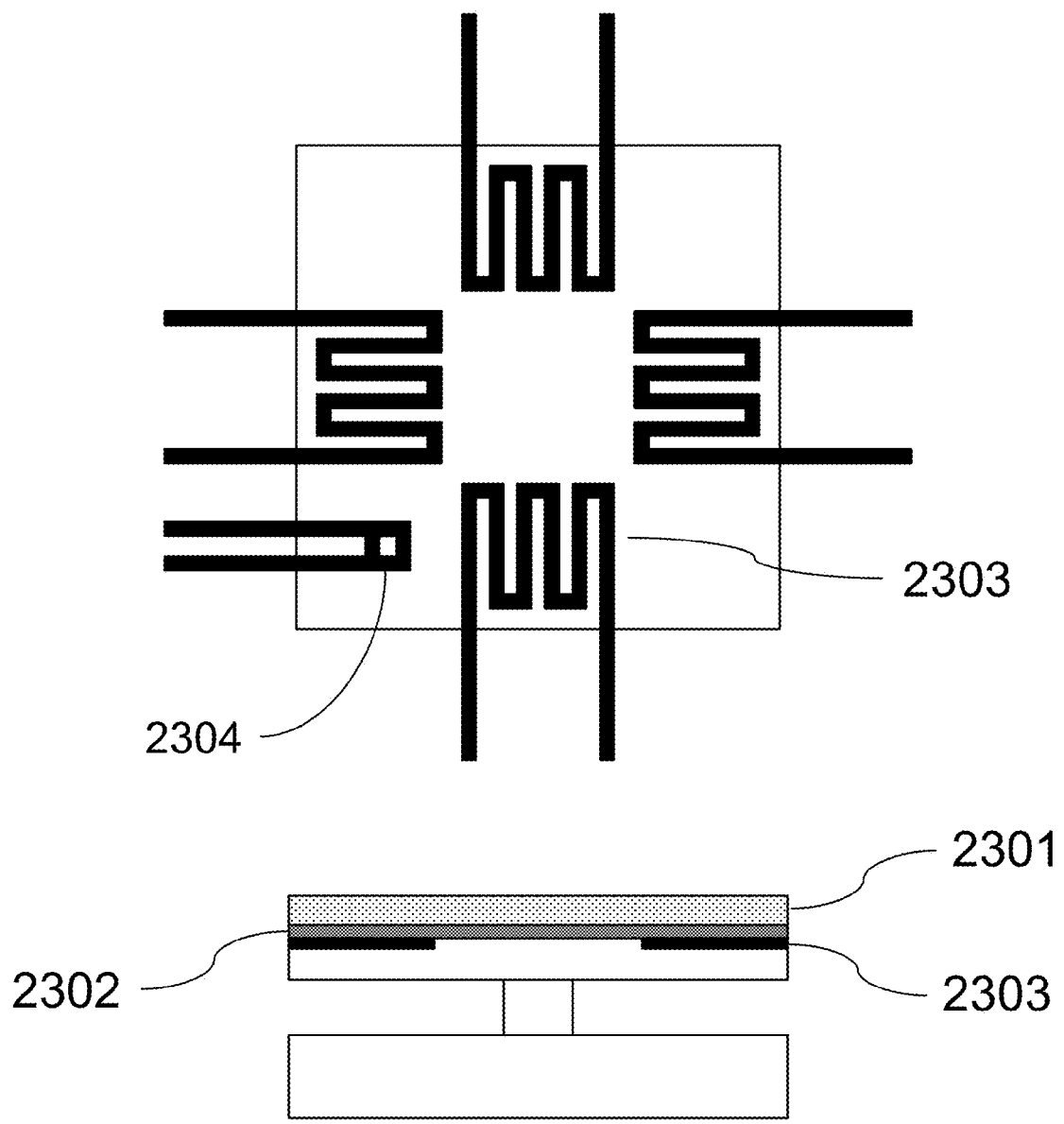
FIG. 23 illustrates a micromirror comprising resistive heating elements for temperature control of the reflective dielectric multilayer.

The reflectivity of some reflective dielectric multilayers is a function of temperature. As the temperature increases, the thickness of each dielectric layer increases, and thus the wavelength of maximum reflectivity will be red-shifted. Certain dielectric layers have a narrow reflective bandwidth (full-width half maximum); a shift of the reflective wavelength is thus detrimental towards device performance. To overcome this, described herein is a thermal compensation method for reducing the effects of temperature on the reflected wavelength. One embodiment for this method is shown in FIG. 23.

The thermal compensation concept described herein includes MEMS-based resistive heaters and temperature sensors to provide a feedback mechanism. As shown in FIG. 23, a dielectric layer 2301 is placed on top of a thermally conductive material 2302. Four resistive heaters 2303 heat each individual micromirror to the desired temperature. The dielectric layer 2301 is tuned to be reflective at the desired wavelength at the desired temperature. A feedback mechanism provides control and stability for the desired temperature. The feedback mechanism can be realized by an independent temperature sensor 2304, or utilizing the changes in the resistivity of the resistive heaters 2303 as the feedback mechanism. For certain embodiments of such a thermal compensation system, the thermal heating caused by the light source is also considered. However, when the dielectric layer is designed to reflect the majority of the light energy, the thermal heating from the light source is minimized.

EXAMPLE 10

Dielectric-Coated DMD for Color Projection Systems

The dielectric coating technique for DMD can be extended beyond lithography purposes. Currently, DMD technology is used for many projection displays. For projection displays, the DMD pixels are switched rapidly at various duty cycles to control the brightness of the image. The colors are controlled by a rapidly spinning color wheel, with separate filters for red, green, and blue light. This method has several disadvantages. First, at any given time, roughly only ⅓ of the available light is transmitted because of the setup of the color filter. Also, this optical train and light projection system is complex, governed by the fact that the color wheel needs to be synchronized with the switching of the mirrors to give appropriate an appropriate brightness of red, green, and blue light for each pixel.

Figure 24:
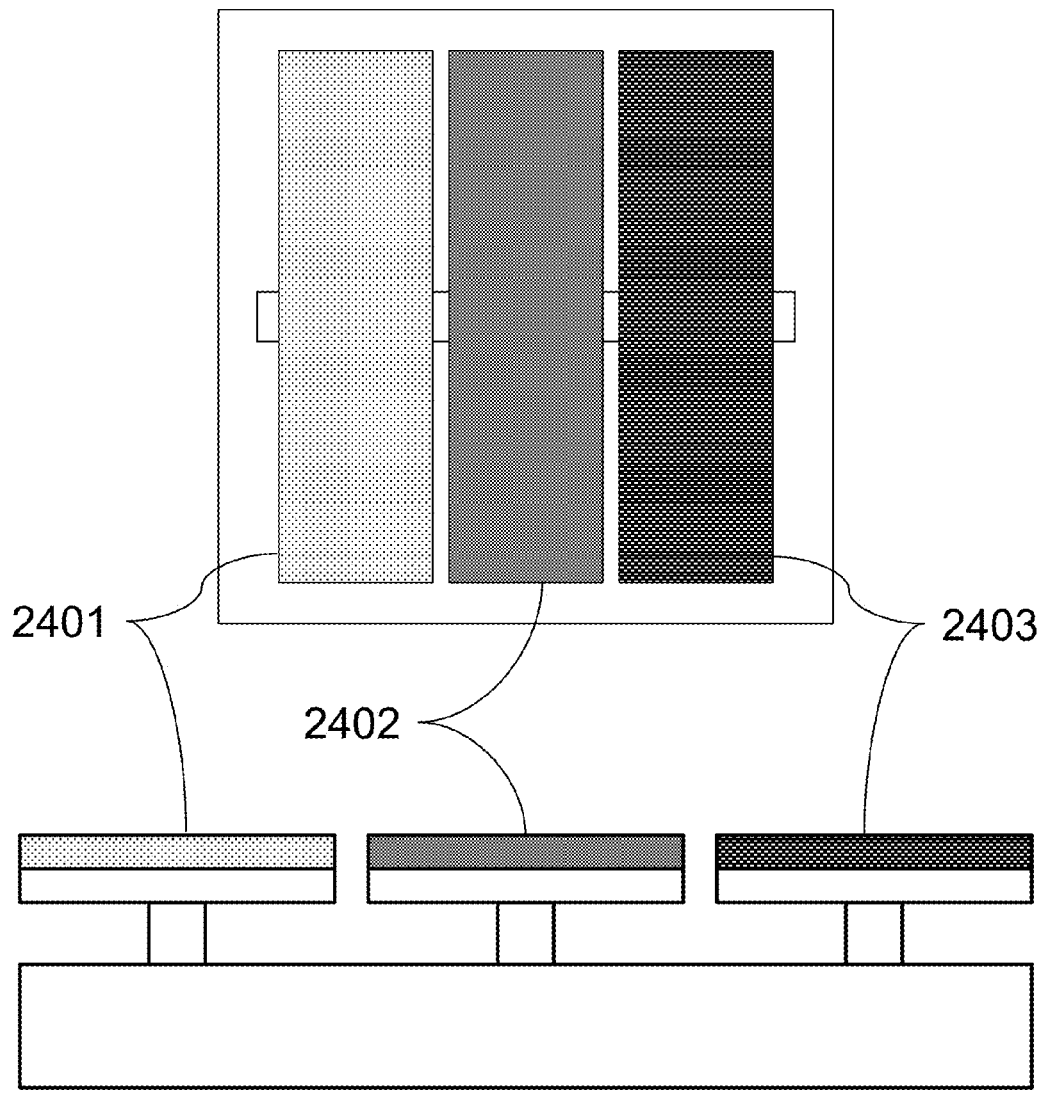
FIG. 24 illustrates a micromirror comprising three separate sub-mirror elements for selective reflection of red, green and/or blue light.

Instead of using a color wheel to control the red, green, and blue wavelengths of light for projection systems, the dielectric coating can be used to reflect or absorb different wavelengths as shown in FIG. 24. FIG. 24 shows top and side views of a micromirror element embodiment, comprising three sub-mirror elements having one of three dielectric coatings. Each sub-mirror element reflects red 2401, green 2402, or blue 2403 wavelengths. Each pixel is thus composed of 3 sub-pixels (red, green, and blue) whose brightness can be independently controlled. Since the intensities of the individual wavelengths of light can be controlled by the micromirror, the color wheel is eliminated from the DMD optical train. The elimination of the color wheel simplifies the optical train which reduces packaging complexity and packaging costs, and also simplifies the driving circuitry of the micromirror.

REFERENCES

U.S. Pat. No. 6,707,534.
U.S. Pat. Nos. 7,170,669 and 7,420,730.
U.S. Pat. No. 7,068,415.
U.S. Pat. No. 6,862,127.
U.S. Pat. No. 7,261,430.
U.S. Pat. No. 6,859,311.
U.S. Pat. No. 7,092,138.
U.S. Pat. No. 7,426,067.
U.S. Pat. No. 6,544,698.
U.S. Pat. No. 5,631,782.
U.S. Pat. No. 6,304,316.
M. Li, P. S. Chung, M. T. Yeung, P. S. Chan, T. K. Liang, C. Shu, K. W. C. Lai, W. J. Li, F. Tong and H. K. Tsang, 2004, Electronic Components and Technology Conference, pages 1400-1405.
M. K. Tripp, F. Fabreguette, C. F. Herrmann, S. M. George and V. M. Bright, 2005, Proceedings of SPIE, Vol. 5720: 241-251.
Friese, Wissmann and Zappe, 2003, Proceedings of IEEE, Sensors, Vol. 1: 667-672.
H. Schenk, A. Wolter, U. Dauderstaedt, A. Gehner and H. Lakner, 2005, J. Microlith., Microfab., Microsyst., 4(4): 041501.
H. Hogan, 2005, Maskless Photolithography May Offer Cost Advantage, http://www.photonics.com/Content/ReadArticle.aspx?ArticleID=23699.
M. Douglass, DMD reliability: a MEMS success story. Reliability testing and characterization of MEMS/MOEMS II, Proceedings of SPIE vol. 4980, 2003.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A micromirror having an exposed surface area, the micromirror comprising:
   a polymeric micromirror base;
   a reflective dielectric multilayer disposed over the polymeric micromirror base, wherein the reflective dielectric multilayer comprises 10 or more dielectric layers;
   a device layer positioned below the polymeric micromirror base for adjusting a position of the micromirror; and
   a resistive heating element in thermal contact with the reflective dielectric multilayer;
   wherein the reflective dielectric multilayer covers more than 50% of the exposed surface area and the reflective dielectric multilayer has a reflectivity selected over the range of 95% to 100% for at least a portion of electromagnetic radiation having wavelengths in the range of 150 to 1100 nm.

2. The micromirror of claim 1, further comprising a thermally conductive or heat dispersing layer in thermal contact with the reflective dielectric multilayer and the resistive heating element.

3. The micromirror of claim 2, wherein the thermally conductive or heat dispersing layer is provided between the reflective dielectric multilayer and the resistive heating element.

4. The micromirror of claim 1, wherein the resistive heating element maintains a temperature of the reflective dielectric multilayer within a 5° C. window.

5. The micromirror of claim 1, wherein the reflective dielectric multilayer has a reflectivity selected over the range of 98% to 100% for at least a portion of electromagnetic radiation having wavelengths in the range of 150 to 1100 nm.

6. The micromirror of claim 1, wherein the reflective dielectric multilayer has a reflectivity selected over the range of 95% to 100% for at least a portion of electromagnetic radiation having wavelengths in the range of 600 to 750 nm.

7. The micromirror of claim 1, wherein the reflective dielectric multilayer has a reflectivity selected over the range of 95% to 100% for at least a portion of electromagnetic radiation having wavelengths in the range of 500 to 600 nm.

8. The micromirror of claim 1, wherein the reflective dielectric multilayer has a reflectivity selected over the range of 95% to 100% for at least a portion of electromagnetic radiation having wavelengths in the range of 400 to 500 nm.

9. The micromirror of claim 1, wherein the reflective dielectric multilayer does not include a metal layer.

10. The micromirror of claim 1, wherein the reflective dielectric multilayer comprises a plurality of dielectric layers selected from the group consisting of: oxides, nitrides, fluorides, and sulfides.

11. The micromirror of claim 1, wherein the reflective dielectric multilayer comprises a plurality of dielectric layers selected from the group consisting of: silicon dioxide, titanium dioxide, hafnium oxide, silicon nitride, magnesium fluoride and zinc sulfide.

12. The micromirror of claim 1, wherein the reflective dielectric multilayer comprises a plurality of dielectric layers, wherein adjacent dielectric layers have different refractive indices and wherein the plurality of dielectric layers alternates between higher and lower refractive index dielectric layers.

13. The micromirror of claim 12, wherein the reflective dielectric multilayer comprises 10 to 1000 of said higher and lower refractive index dielectric layers.

14. The micromirror of claim 12, wherein each of the higher refractive index dielectric layers has a refractive index selected over the range of 1.2 to 2.9 and each of the lower refractive index dielectric layers has a refractive index selected over the range of 1.1 to 2.8.

15. The micromirror of claim 12, wherein each of the dielectric layers has a thickness selected over the range of 10 nm to 100 µm.

16. The micromirror of claim 1, wherein the polymeric micromirror base comprises a polymer selected from the group consisting of: SU-8, polyimide, photoresists, polydimethylsiloxane (PDMS), polymethyl methacrylate (PMMA), polyparaxylene (parylene), polytetrafluoroethylene (Teflon), liquid crystal polymers and any combination of these.

17. The micromirror of claim 1, having a width selected over the range of 5 to 100 µm.

18. The micromirror of claim 1, having a length selected over the range of 5 to 100 µm.

19. The micromirror of claim 1, wherein the exposed surface area of the micromirror is greater than or equal to 25 µm$^2$.

20. The micromirror of claim 1, wherein the exposed surface area of the micromirror is selected over the range of 25 µm$^2$ to 1 mm$^2$.

21. The micromirror of claim 1, wherein the reflective dielectric multilayer covers 90% to 100% of the exposed surface area of the micromirror.

22. The micromirror of claim 1, wherein the resistive heating element is a MEMS-based resistive heater.

23. The micromirror of claim 1, comprising four resistive heating elements in thermal contact with said reflective dielectric multilayer.

24. The micromirror of claim 1, wherein the resistive heating element maintains a temperature of the reflective dielectric multilayer within a 1° C. window.

25. The micromirror of claim 1, further comprising a temperature sensor in thermal contact with the reflective dielectric multilayer.

26. A large area micromirror array comprising a plurality of micromirror elements, wherein each micromirror element has an exposed surface area and comprises a polymeric micromirror base, a reflective dielectric multilayer disposed over the polymeric micromirror base and a resistive heating element in thermal contact with the reflective dielectric multilayer, wherein the reflective dielectric multilayer comprises 10 or more dielectric layers, wherein the reflective dielectric multilayer covers 50% to 100% of the exposed surface area and wherein the reflective dielectric multilayer has a reflectivity selected over the range of 95% to 100% for at least a portion of electromagnetic radiation having wavelengths in the range of 150 to 1100 nm.

27. A digital micromirror display device comprising:
a source of electromagnetic radiation; and
a micromirror array comprising a plurality of micromirror elements, wherein each micromirror element has an exposed surface area exposed to electromagnetic radiation from the source and comprises a polymeric micromirror base and a reflective dielectric multilayer disposed over the polymeric base and a resistive heating element in thermal contact with the reflective dielectric multilayer, wherein the reflective dielectric multilayer comprises 10 or more dielectric layers, wherein the reflective dielectric multilayer covers 50% to 100% of the exposed surface area and wherein the reflective dielectric multilayer has a reflectivity selected over the range of 95% to 100% for at least a portion of electromagnetic radiation having wavelengths in the range of 150 to 1100 nm.

28. A method of displaying an image, the method comprising the steps of:
providing a surface for displaying the image;
providing a source of electromagnetic radiation;
providing an array of micromirror elements, wherein each micromirror element has an exposed surface area exposed to electromagnetic radiation from the source and comprises a polymeric micromirror base, a reflective dielectric multilayer disposed over the polymeric micromirror base and a resistive heating element in thermal contact with the reflective dielectric multilayer, wherein the reflective dielectric multilayer comprises 10 or more dielectric layers, wherein the reflective dielectric multilayer covers 50% to 100% of the exposed surface area and wherein the reflective dielectric multilayer has a reflectivity selected over the range of 95% to 100% for at least a portion of electromagnetic radiation having wavelengths in the range of 150 to 1100 nm;
controlling a position of each micromirror element of the array such that electromagnetic radiation from the source is reflected from each micromirror element to a location either on or off of the surface; and
directing electromagnetic radiation from the source onto the micromirror array, thereby displaying an image on the surface.

* * * * *